United States Patent
Lam et al.

(10) Patent No.: US 10,521,097 B1
(45) Date of Patent: Dec. 31, 2019

(54) USER INTERFACE TO IMPLEMENT TOPOLOGY INTEGRITY THROUGHOUT ROUTING IMPLEMENTATIONS

(71) Applicant: Cadence Design Systems, Inc., San Jose, CA (US)

(72) Inventors: Hoi-Kuen Lam, Saratoga, CA (US); Chung-Do Yang, Saratoga, CA (US); John Mario Wilkosz, Pflugerville, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/721,648

(22) Filed: Sep. 29, 2017

(51) Int. Cl.
| | | |
|---|---|---|
| *G06F 3/048* | (2013.01) | |
| *G06F 17/50* | (2006.01) | |
| *G06F 3/0484* | (2013.01) | |
| *H01L 21/70* | (2006.01) | |
| *H04L 12/753* | (2013.01) | |

(52) U.S. Cl.
CPC ...... *G06F 3/04847* (2013.01); *G06F 3/04842* (2013.01); *H01L 21/70* (2013.01); *H04L 45/48* (2013.01)

(58) Field of Classification Search
CPC . G06F 3/30484; G06F 3/04847; H01L 21/70; H04L 45/48
USPC ................................ 716/100, 101, 102, 139
See application file for complete search history.

(56) References Cited

U.S. PATENT DOCUMENTS

| | | |
|---|---|---|
| 5,774,371 A | 6/1998 | Kawakami |
| 5,877,091 A | 3/1999 | Kawakami |
| 6,256,766 B1 | 7/2001 | Luo |
| 6,260,176 B1 | 7/2001 | Chen |
| 6,446,239 B1 * | 9/2002 | Markosian et al. ........................ G06F 17/5072 716/122 |
| 6,449,761 B1 * | 9/2002 | Greidinger et al. ........................ G06F 17/5072 716/122 |
| 6,543,041 B1 | 4/2003 | Scheffer |
| 7,100,128 B1 | 8/2006 | Neauist |
| 7,594,214 B1 | 9/2009 | Salowe |
| 8,510,699 B1 | 8/2013 | Acar |
| 8,607,182 B2 * | 12/2013 | Chen et al. .......... G06F 17/5072 716/102 |
| 8,635,576 B2 | 1/2014 | Zhao |
| 8,806,405 B2 * | 8/2014 | Colwell et al. ..... G06F 17/5077 716/101 |
| 8,898,039 B1 * | 11/2014 | Kukal et al. ........ G06F 17/5045 703/1 |
| 9,009,645 B2 | 4/2015 | Cao |
| 9,245,082 B2 | 1/2016 | Birch |

(Continued)

OTHER PUBLICATIONS

Final Office Action dated Sep. 19, 2019 for U.S. Appl. No. 15/721,655.

(Continued)

*Primary Examiner* — Sun J Lin
(74) *Attorney, Agent, or Firm* — Vista IP Law Group, LLP

(57) ABSTRACT

Described herein is an improved approach to implement routing for electrical designs. A structural routing solution is provided, where a routing system is implemented to generate a complete routing tree. A user interface is provided that captures users' design intent about topology of an electrical design, and the routing system adheres to that user's design intent about the topology throughout a layout process for the electrical design.

20 Claims, 26 Drawing Sheets

(56) References Cited

U.S. PATENT DOCUMENTS

| | | | |
|---|---|---|---|
| 9,552,454 | B2 | 1/2017 | Chowdhury |
| 9,910,951 | B2 | 3/2018 | Vedantam |
| 1,020,420 | A1 | 2/2019 | Loh |
| 2004/0230933 | A1 | 11/2004 | Weaver, Jr. |
| 2004/0267511 | A1 | 12/2004 | Hayes |
| 2006/0161874 | A1 | 7/2006 | Harada |
| 2008/0115099 | A1 | 5/2008 | Patra |
| 2009/0288056 | A1 | 11/2009 | Gitchev |
| 2010/0190277 | A1 | 7/2010 | Lin |
| 2012/0023472 | A1 | 1/2012 | Fischer |
| 2014/0123094 | A1* | 5/2014 | Colwell et al. ..... G06F 17/5077 716/126 |
| 2014/0181777 | A1 | 6/2014 | Cao |
| 2015/0205906 | A1 | 7/2015 | Barwin, III |
| 2017/0053054 | A1 | 2/2017 | Vedantam |
| 2017/0085433 | A1* | 3/2017 | Kato et al. ............. H04L 12/46 |
| 2017/0161408 | A1 | 6/2017 | Sherman |

OTHER PUBLICATIONS

Notice of Allowance dated Sep. 27, 2019 for U.S. Appl. No. 15/852,957.
Non-Final Office Action dated May 14, 2019 for U.S. Appl. No. 15/721,655.
Non-Final Office Action dated Jun. 10, 2019 for U.S. Appl. No. 15/852,957.
Notice of Allowance dated Jul. 18, 2019 for U.S. Appl. No. 15/852,957.

\* cited by examiner

Fig. 6A

USER INTERFACE TO IMPLEMENT TOPOLOGY INTEGRITY THROUGHOUT ROUTING IMPLEMENTATIONS

CROSS-REFERENCE TO RELATED APPLICATIONS

The present application is related to co-pending U.S. application Ser. No. 15/721,655, entitled "Method and System to Implement Topology Integrity Throughout Routing Implementations", which is hereby incorporated by reference in its entirety.

FIELD

This disclosure relates to the field of electrical design.

BACKGROUND

A semiconductor integrated circuit (IC) has a large number of electronic components, such as transistors, logic gates, diodes, wires, etc., that are fabricated by forming layers of different materials and of different geometric shapes on various regions of a silicon wafer. The design of an integrated circuit transforms a circuit description into a geometric description called a layout. The process of converting specifications of an integrated circuit into a layout is called the physical design.

Chip designers often use electronic design automation (EDA) software tools to assist in the design process. Chip design using EDA software tools generally involves an iterative process whereby the chip design is gradually perfected. A top-down design methodology is commonly employed using hardware description languages (HDLs), such as Verilog or VHDL for example, by which the designer creates an integrated circuit by hierarchically defining functional components of the circuit, and then decomposing each component into smaller and smaller components.

The various components of an integrated circuit are initially defined by their functional operations and relevant inputs and outputs. From the HDL or other high level description, the actual logic cell implementation is typically determined by logic synthesis, which converts the functional description of the circuit into a specific circuit implementation. The logic cells are then "placed" (e.g., given specific coordinate locations in the circuit layout) and "routed" (e.g., wired or connected together according to the designer's circuit definitions). The placement and routing software routines generally accept as their input a flattened netlist that has been generated by the logic synthesis process. This flattened netlist identifies the specific logic cell instances from a target standard cell library, and describes the specific cell-to-cell connectivity. In the area of custom designs, where complexity is less than digital design, the 'logic synthesis' approach is not taken, and the user can instead directly conduct placement and routing based on the logic connection blueprint (schematic). In addition, with respect to custom designs, users may hand-craft their own proprietary library of components, rather than using standard-cell library, just for better optimization. In both design styles, automatic or assisted placement and routing are commonly used to facilitate the process and gain advantage on fast turn-around time from design to manufacturing, and then to final products.

Conventionally, routing is accomplished using a two-staged process of first performing global routing followed by detail routing. A global router does not normally make any specific connections, but provides a general plan for making the connections. The router first global routes the whole chip or large portions of the chip before implementing detail routing of any part or whole of the chip. During detail routing, the detailed router determines the exact location and layers for each interconnect, based upon the set of metal rules that have been provided to the chip designer. However, conventional routers that use the global route/detail route approach are implemented with a distinctive separation between the global router and the detail router which prevents effective and efficient interaction between the two types of routers.

Conventional "area-based" routers include techniques that implement the ability to look at each area of the design, and to thoroughly handle any routing activities that are needed to route any nets through that area of the design currently being focused on. However, since this approach analyzes and routes each small portion of the design independently from one another, this means that there is very little structural control over the overall topology that can be applied during the routing process.

Structural routing approaches have also been attempted, where a user provides an upfront structure to the topology in a structural global routing stage, followed by the automated detail routing implementation. However, conventional structural routers also suffer from many deficiencies. One significant problem with known structural routers is that during the detail routing stage (such as during "rip up and re-route" processing), topology controls are lost and thus the final routed design may be significantly different from the originally intended topological structure. Another problem with this approach is that it requires manual processing by the user to define the upfront structure, which is especially problematic given that modern electronic designs have become extremely complicated with immense numbers of components, objects, and rules that need to be considered even to begin a manual process to insert any element into the design.

Therefore, there is a need for an improved approach to implement routing that that can adequately address these and other problems with the conventional tools.

SUMMARY

Embodiments of the invention provide an improved method, system, and computer program product to implement routing for electrical designs. The inventive approach provides a structural routing solution, where an automatic routing mechanism is implemented to generate a complete routing tree. In some embodiments, a user interface is provided that captures users' design intent about the topology, and the routing system adhere to that topology intent throughout the layout process. A congestion-driven, fishbone-style router can be implemented for custom-digital/memory-style designs.

Further details of aspects, objects, and advantages of the invention are described below in the detailed description, drawings, and claims. Both the foregoing general description and the following detailed description are exemplary and explanatory, and are not intended to be limiting as to the scope of the invention.

BRIEF DESCRIPTION OF THE DRAWINGS

In order that the present invention is better understood, some embodiments of the invention will now be described, by way of example only, with reference to the accompanying drawings.

FIGS. 6A-H and 7A-G provide an illustration of the inventive process.

DETAILED DESCRIPTION

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

Embodiments of the invention provide an approach that permits capture of a user's "design intent" about the circuit design's topology and adhere to it throughout the layout process. In particular, a tree-based routing process is provided that allows automated generation of topological structure based upon user's input constraints, where that topological structure is then preserved and/or employed through any detail routing phases. This means that the topology can be carried all the way from early planning through to detail implementation.

Figure 1:
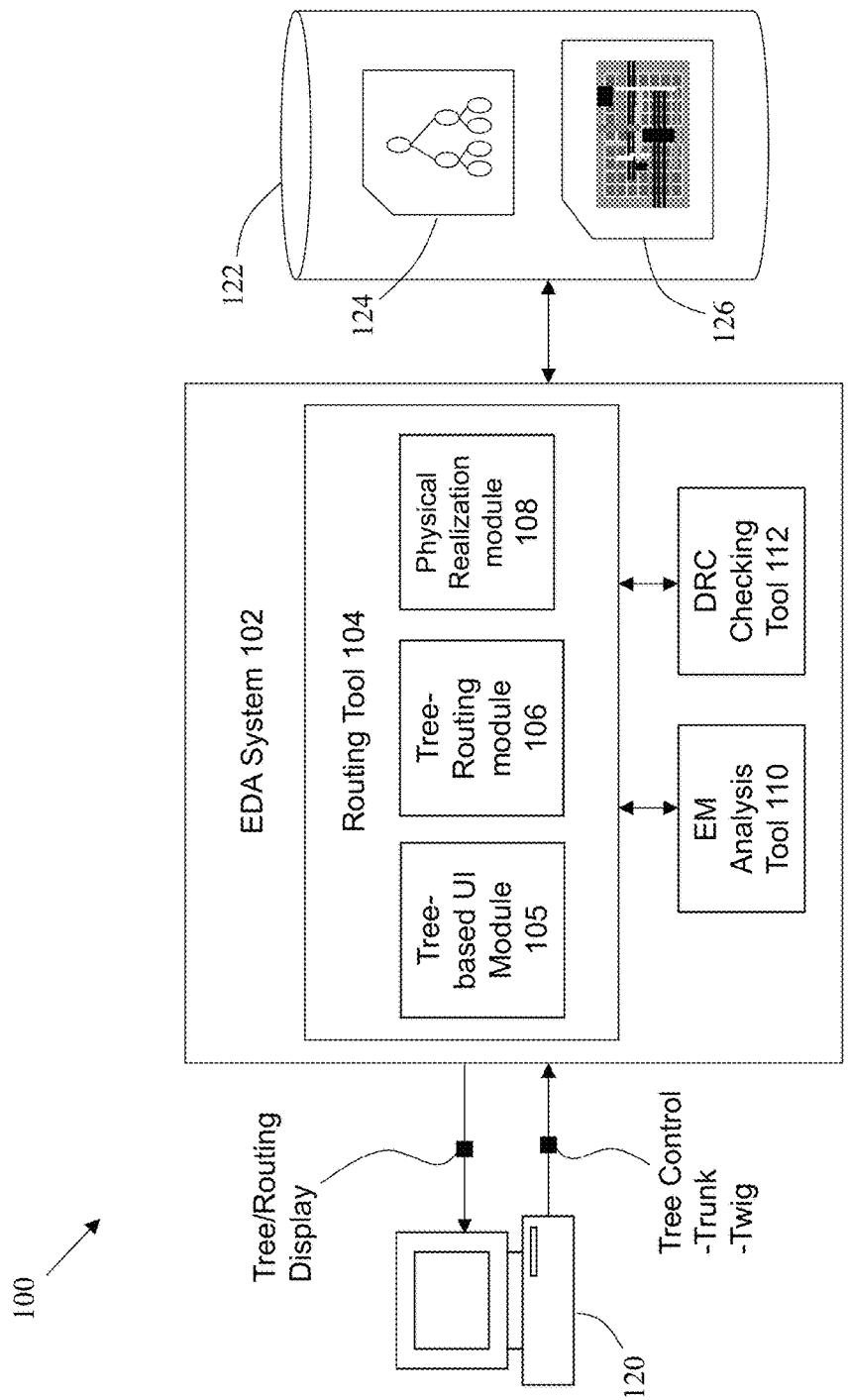
FIG. 1 illustrates an example system which may be employed in some embodiments of the invention.

FIG. 1 illustrates an example system 100 which may be employed in some embodiments of the invention. System 100 may include one or more users that interface with and operate a computing system to control and/or interact with system 100 using a computing station 120. Such users include, for example, design engineers or verification engineers. The computing system comprises any type of computing station 120 that may be used to operate, interface with, or implement one or more EDA systems/applications 102. Examples of such computing systems include for example, servers, workstations, personal computers, or remote computing terminals connected to a networked or cloud-based computing platform. The computing system may comprise one or more input devices for the user to provide operational control over the activities of the system 100, such as a mouse or keyboard to manipulate a pointing object.

In operation, embodiments of the invention constructs a logical tree based at least in part upon user intent, where the tree includes information pertaining to "trunks" that form main connections that connect to pins through "twig" structures. The organization, size, location, and number of trunks are established by having the user provide specific constraints upon those trunks. A UI (user interface) module 105 can be employed to generate a receive user interface to user constraints from the user at computing station 120. Such constraints may include, for example, maximum trunk length, minimum trunk length, trunk orientation, maximum twig length, and/or maximum number of pins per trunk.

A tree routing module 106 takes the user-provided constraints, and generates one or more possible topological configurations that conform to the user intent (as encapsulated by the provided constraints). The tree router main control module builds the logical tree structure that corresponds to a topological configuration for the design.

A physical realization module 108 is provided in the system 100 of FIG. 1 to perform physical implementation of the structured identified in the logical tree. In some embodiments, the physical realization module 108 is implemented as a channel graph mechanism, which captures instance rows, channels, and macros into a floor-plan data structure. It is this module that implements the physical design of the actual trunks during the routing process.

While not shown in this figure, additional modules may be employed to perform various aspect of detail routing within the system. For example, a pin-to-trunk (P2T) mechanism may be provided to connect pins to first level trunks. In addition, a minimum spanning tree (MST) mechanism may be provided to apply MST techniques to route certain of the structures within the design. Example approaches to implement some or all of these techniques are described in U.S. Pat. Nos. 7,676,781 and 9,208,277, which are hereby incorporated by reference in their entirety.

The EDA system 102 further includes DRC (design rule check) checking tool 112 to check for any rules violations that may exist for any of the routing configurations generated by routing tool 104. Design rules are a series of parameters provided by semiconductor manufacturers, specifying geometric and connectivity restrictions to provide sufficient margins to account for variability in semiconductor manufacturing processes. The DRC checking tool is applied to verify the correctness of any designs, and to identify possible issues that may affect overall yield or reliability for the design.

An EM (electromigration) analysis tool 110 may be provided in system 102 to interface with routing tool 104. Electromigration pertains to the concept of displacement of materials in conductive structures due to operation of that structure to conduct electronic signals. As IC designs become progressively more complicated and at smaller feature sizes, the reliability of individual components may be significantly affected by electromigration effects. Therefore, EM analysis tool 110 is provided to perform EM analysis upon routing configurations generated by routing tool 104.

The data generated by EDA system 102, including for example, logical tree data 124 and any physical design data 126, may be stored in a computer readable storage medium 122. The computer readable storage medium 122 includes any combination of hardware and/or software that allows for ready access to the data that is located at the computer readable storage medium 122. For example, computer readable storage medium 122 could be implemented as computer memory and/or hard drive storage operatively managed by an operating system, and/or remote storage in a networked storage device, such as networked attached storage (NAS), storage area network (SAN), or cloud storage. The computer readable storage medium 122 could also be implemented as an electronic database system having storage on persistent and/or non-persistent storage.

Figure 2:
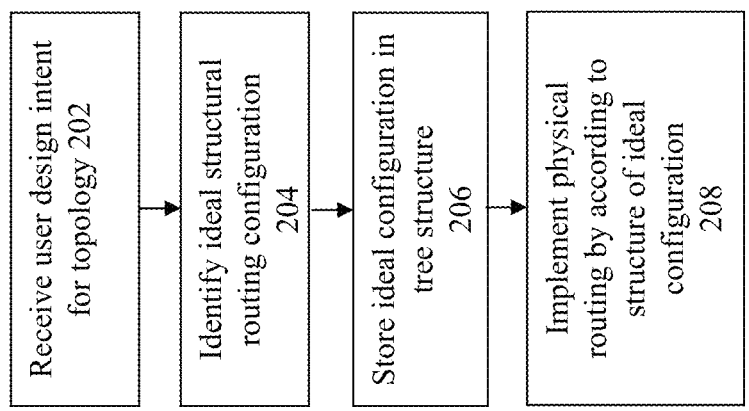
FIG. 2 shows a high level flowchart of an approach to implement some embodiments of the invention.
Figure 3A:
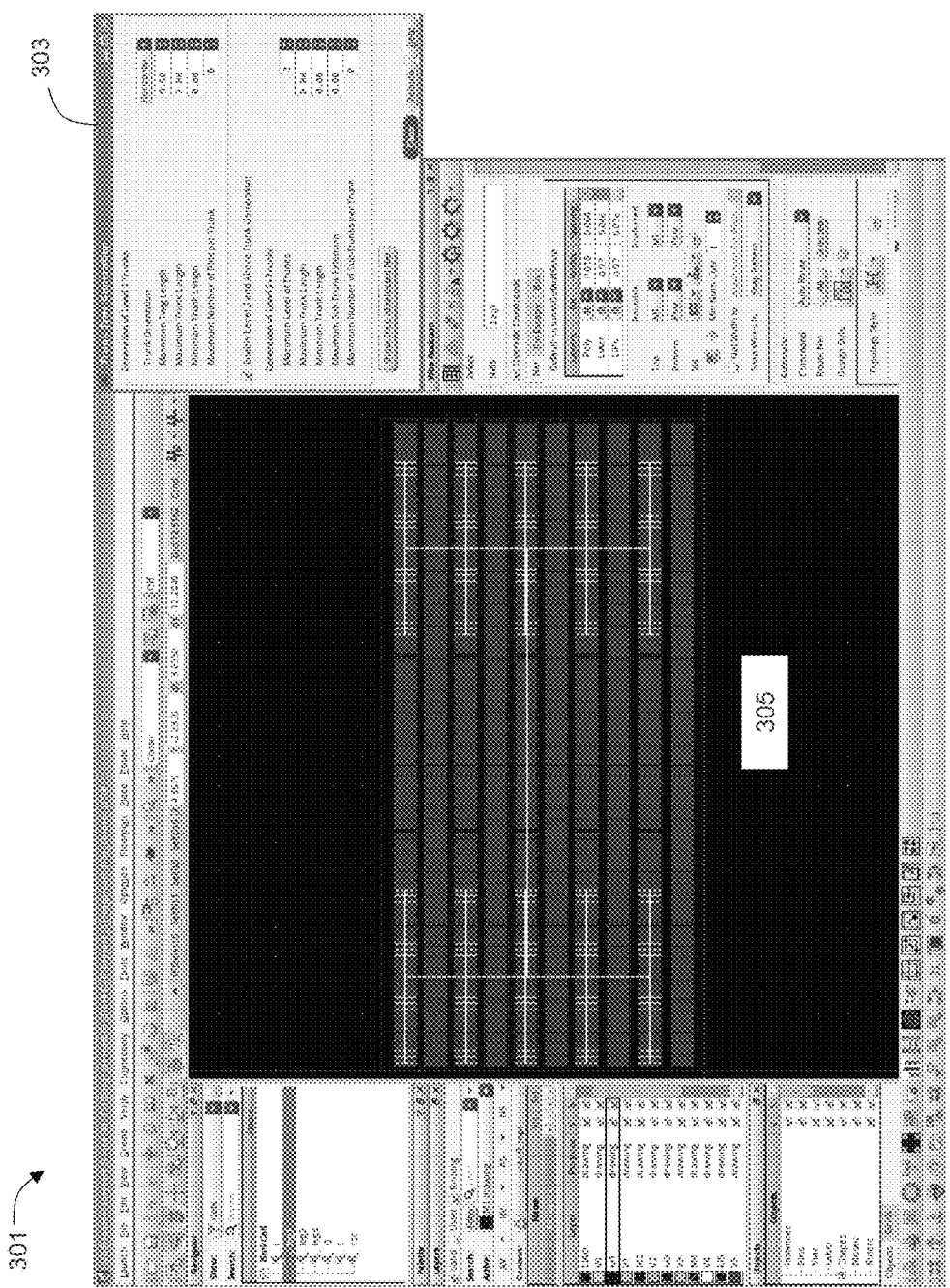
FIGS. 3A-B show illustrations of example user interfaces that may be employed to receive a user's intent regarding the topology.
Figure 3B:
Figure 3C:
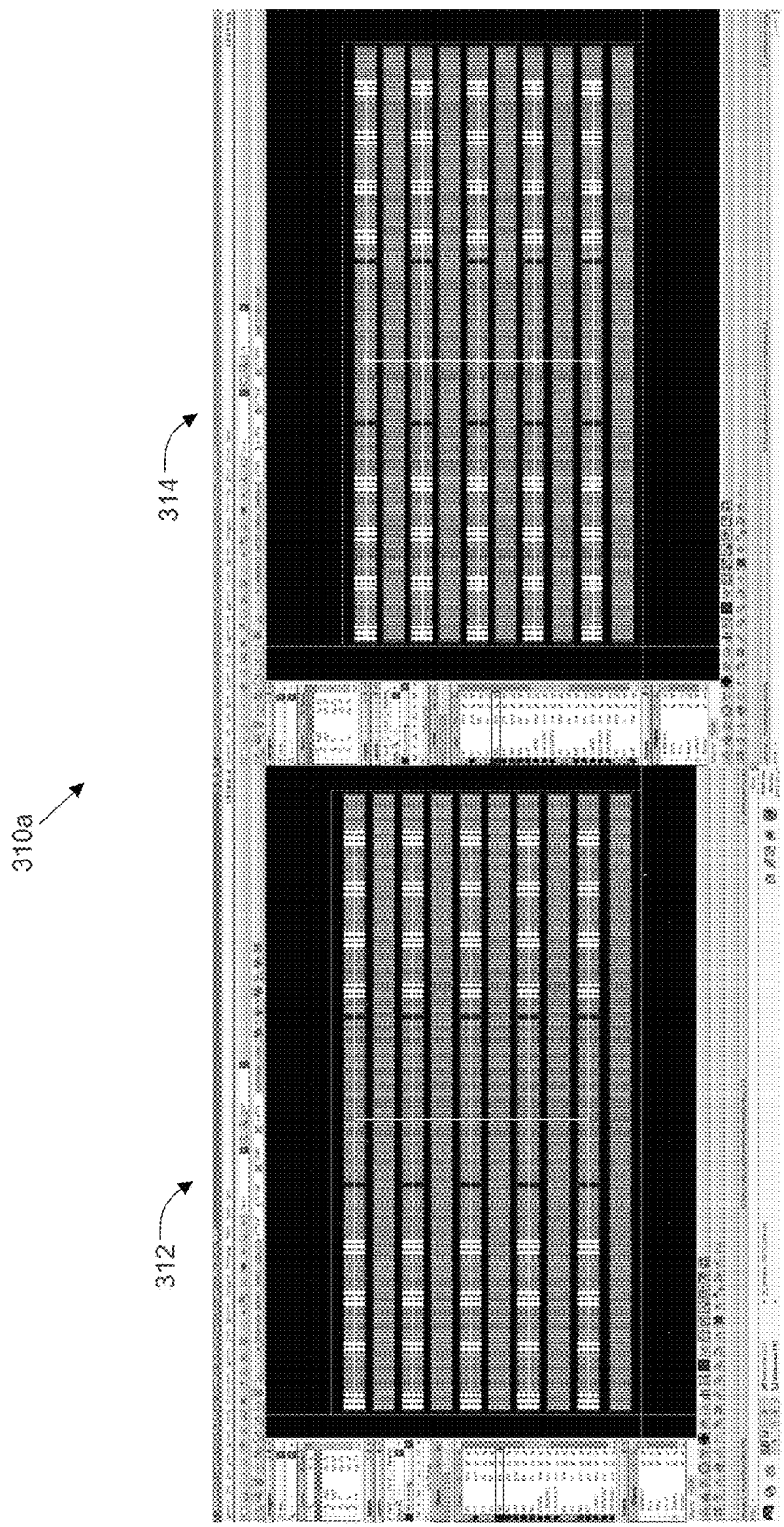
FIGS. 3C-D show illustrations of example user interfaces that may be employed to compare an ideal tree configuration against an implemented tree configuration.
Figure 3D:
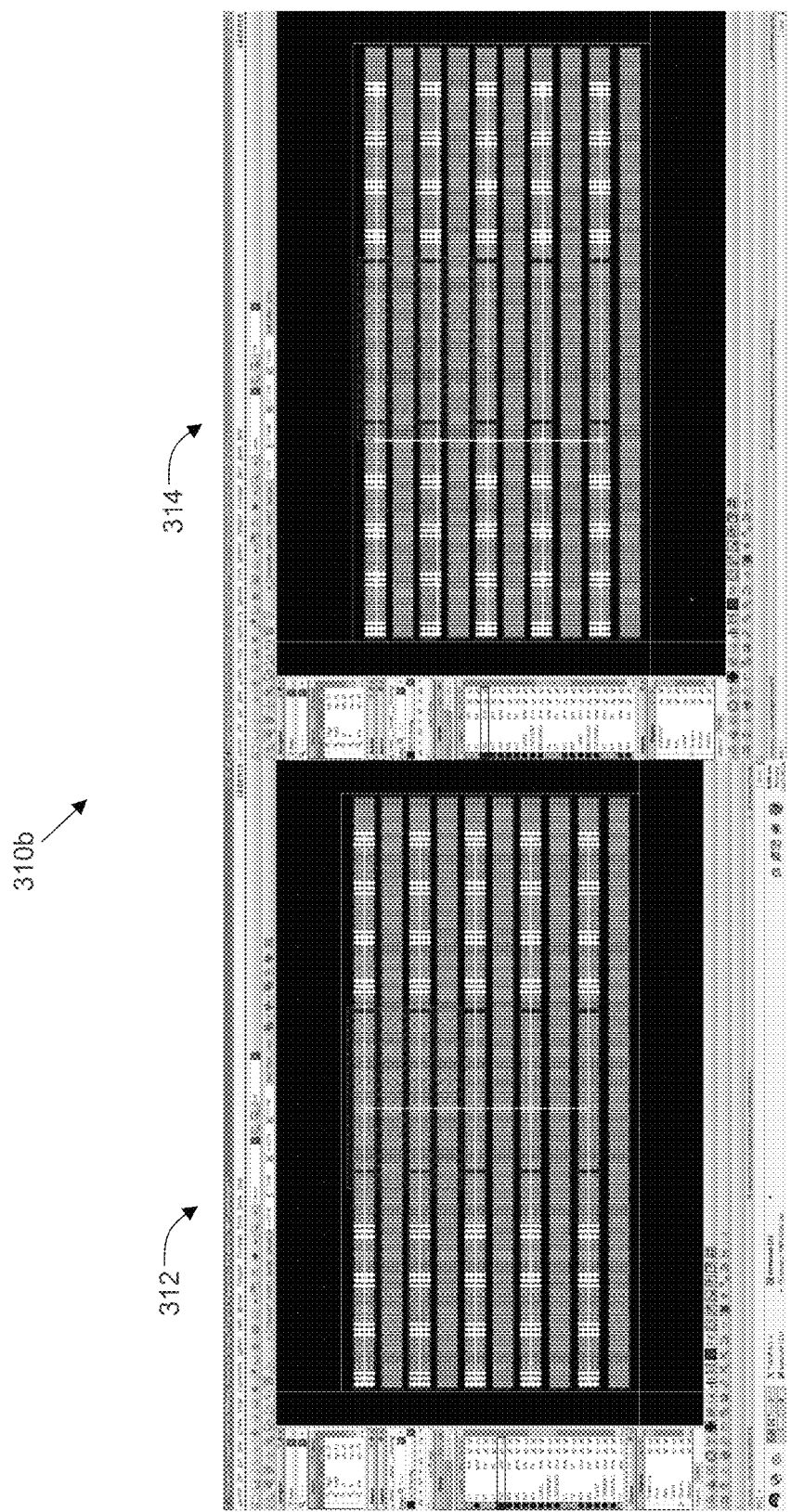

FIG. 2 shows a high level flowchart of an approach to implement some embodiments of the invention. At 202, the routing system receives the user's intent regarding the topology. FIG. 3A shows an illustration of an example user interface 301 that may be employed to receive a user's intent regarding the topology. The user interface 301 may include one or more control interfaces 303, having configurable fields for receiving user entry of values. FIG. 3D shows a more detailed illustration of control interfaces 303, where the interface includes controls to configure some or all of (a) maximum trunk length, (b) minimum trunk length, (c) trunk orientation, (d) maximum twig length, and/or (e) maximum number of pins per trunk. It is noted that these configurations may be provided individually and/or separately for different levels of the logic trunks. For example, a first portion of control interface 303 may be operable to configure a first level logical trunk, while a second portion is operable to configure one or more additional levels of the logical trunk. User interface 301 may include an interface window 305 to display a representation of the logical tree showing locations of trunks, pins, and twigs.

At 204 of FIG. 2, an ideal structural configuration is identified. As previously discussed, the tree router takes the user-provided constraints, and generates one or more possible topological configurations that correspond to the constraints provided by the user. At 206, a logical tree structure is then constructed that corresponds to one of the proposed topological configuration for the design that is selected by the user as the "ideal".

A topology can be considered as an ideal topology if it corresponds to one (of potentially many topologies) that satisfy the users' constraints. In some embodiments, the term "ideal" refers to the one topology that is chosen (e.g., by the EDA tool) and stored in topology at this point in time. The ideal topology essentially provides a reference topology for later steps in the design process.

Figure 4A:
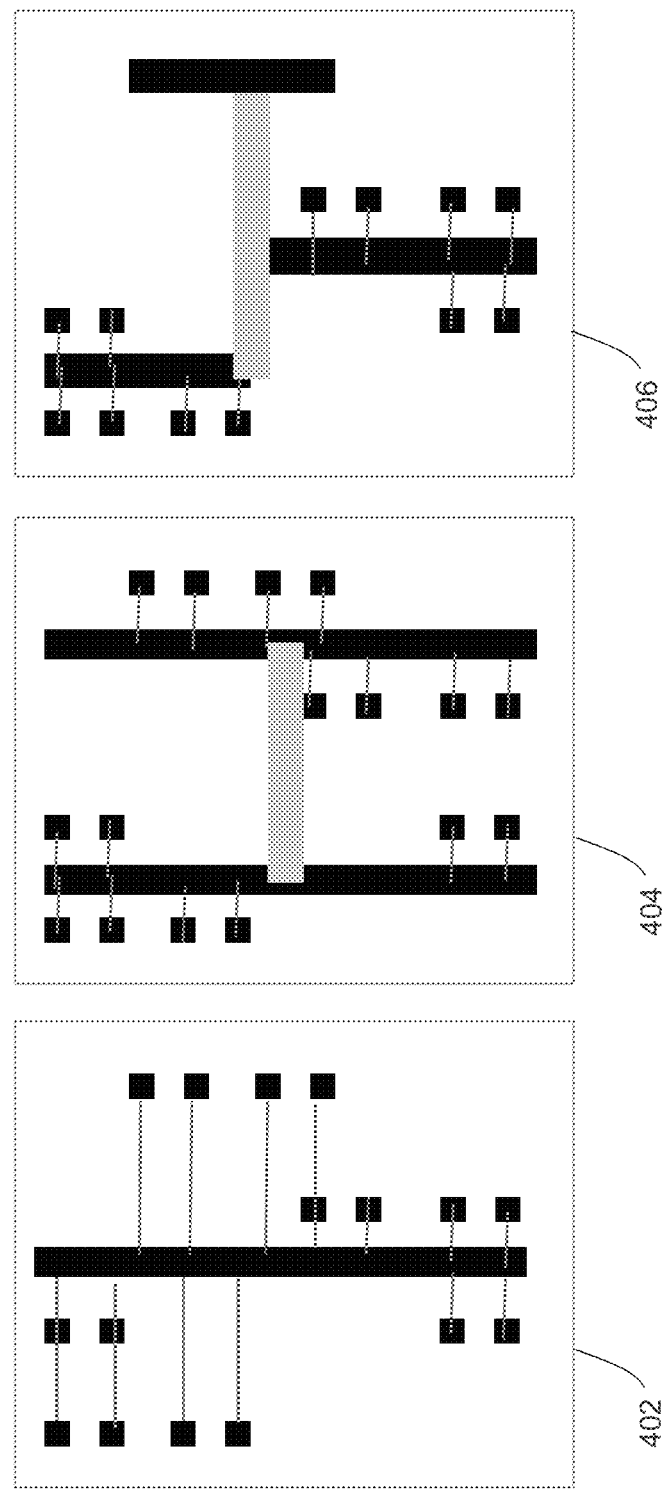
FIG. 4A provides illustrations of some different example logical trees that may be constructed for the same set of pins depending upon specific constraints that may be provided by the user.

FIG. 4A provides illustrations of some different example logical trees that may be constructed for the same set of pins depending upon specific constraints that may be provided by the user. Structure 402 shows a topology that includes a single trunk to connect to the multiple pins. This approach may be taken if the user specifies that a longer total twig length is permissible for the topology. Since there is only a single trunk, this means that there may be less trunk-layer congestion from this topology. Structure 404 shows a topology where two level-1 trunks are provided with a single level-2 trunk that ties the two level-1 trunks together. This approach may be generated if the constraints specify a shorter total twig length, which means that there may be less twig-layer congestion. Structure 406 shows yet another possible configuration, where the topology includes three shorter level-1 trunks and much shorter total twig lengths. This approach provides better pin clustering, and may provide an acceptable balanced choice.

Figure 4B:
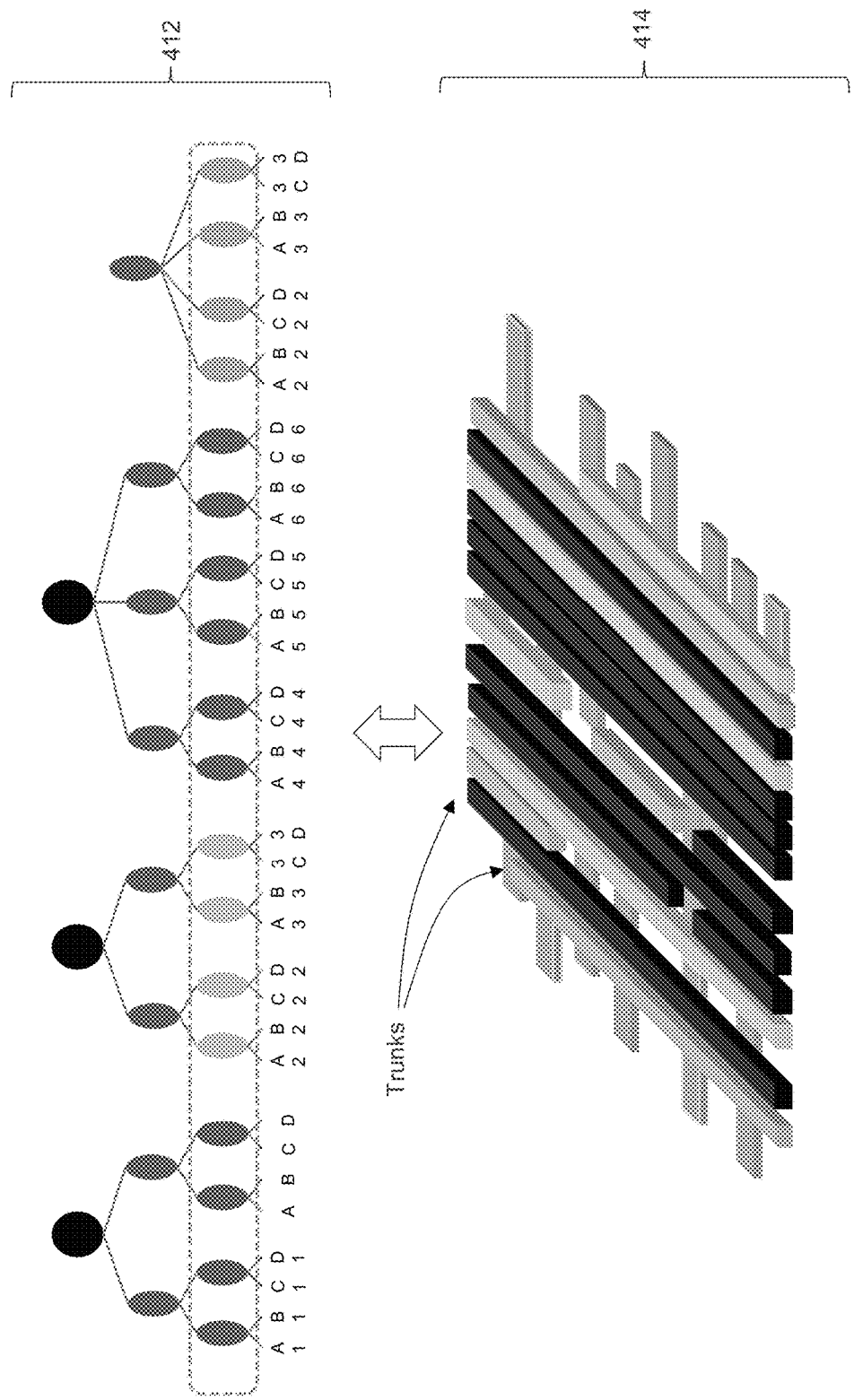
FIG. 4B illustrates an example logical tree structure.

As illustrated in FIG. 4B, a logical tree structure 402 is employed to track and guide the implementation of the physical implementation 404. The tree structure 402 may be implemented as a tree object of an object class that includes tree-specific attributes, such as any net-based constraints that have been configured for the tree. Within the tree object, one or more trunks may be logically represented, where each trunk is configured to include one or more of the following information: (a) trunk layer; (b) trunk start location/coordinate; (c) trunk end location/coordinate; (d) layer and/or (e) trunk width. This information can be maintained for the ideal configuration of the trunks. In addition, as discussed in more detail below, the trunk information within the tree may also contain details regarding implemented values for trunk attributes. This is because, as the trunk is physically realized in the design, the attributes for the trunk may vary from the ideal in terms of its the location, size, and/or dimensions, and the defined attributes for the physically realized trunks can be stored within the same tree structure as the ideal configuration attributes.

The logical tree may also include information about pins and/or twigs. In some embodiment, the specific detailed information for a pin (such as pin location, dimension, and/or layer) may be materialized in the logical tree structure. In alternate embodiments, the specific pin information may be stored in a separate pin database structure, with the logical tree including a link to that other database. Twig information may be derived from the ideal trunk location/size and the pin location/size, particularly when the actual physical routing configurations have not yet been realized. Alternatively, specific twig configuration information may be stored within the logical tree structure in some embodiments.

It is the ability of the logical tree to capture the user's design intent about the topology that allows structure in the topology to be carried through into the rest of the layout process. This because, when the physical routing details are implemented in later stages of the routing process (at step 208 of FIG. 2), those later routing actions will check possible solutions against the ideal configuration. This may be implemented, for example, by using a cost-based analysis approach, where the cost of any possible solution is identified relative to the ideal configuration, where solutions that more closely conform to the ideal configuration corresponds to lower costs while solutions that deviate more from the ideal configuration corresponds to higher costs.

Figure 5:
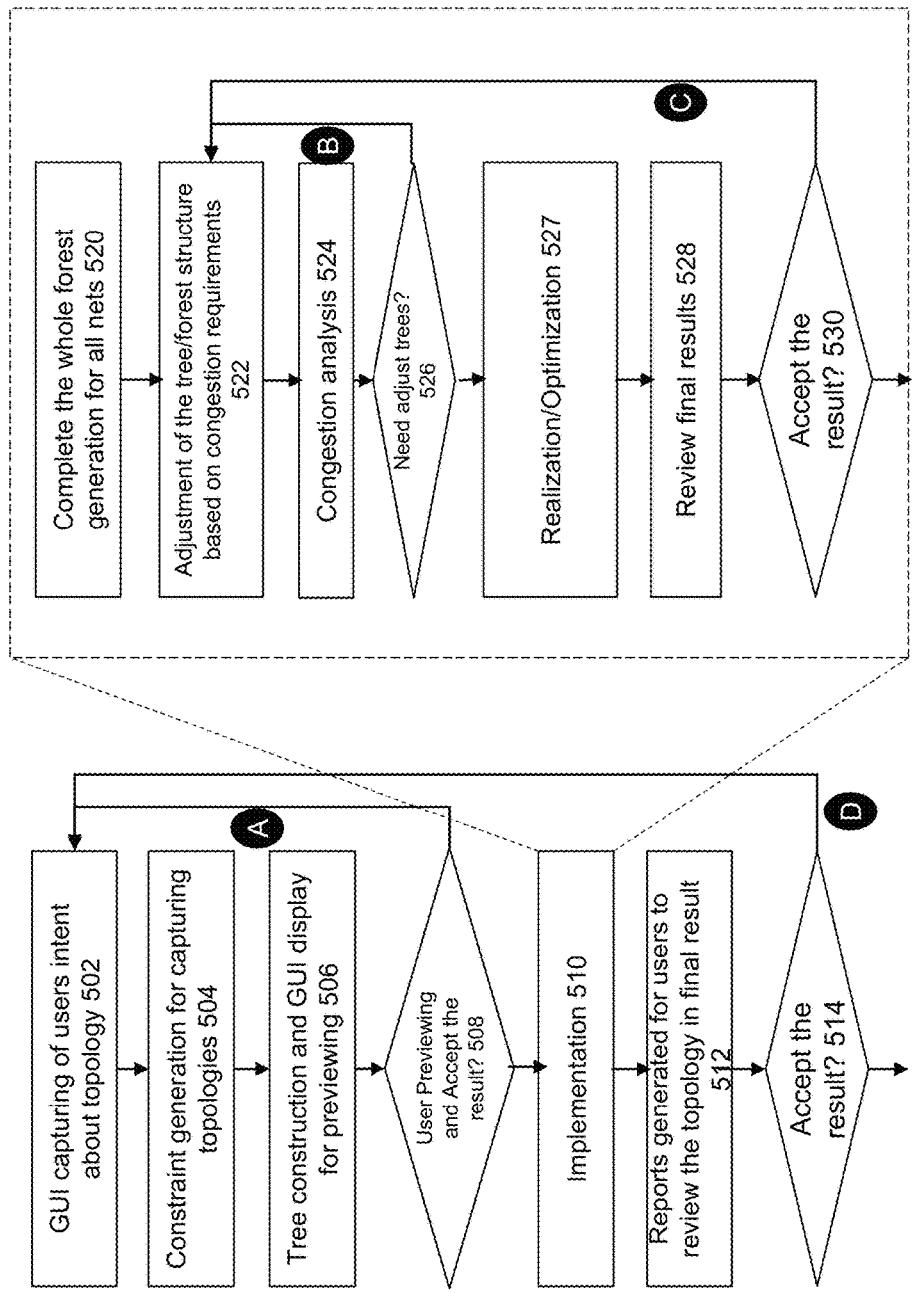
FIG. 5 shows a more detailed flowchart for implementing tree routing according to some embodiments of the invention.

FIG. 5 shows a more detailed flowchart for implementing tree routing according to some embodiments of the invention. Loop A is the starting portion of the process, where at 502, a GUI (e.g., as shown in FIGS. 3A-B) is presented to users that graphically allow for the user intent to be captured for the topology. At 504, through the GUI, constraint generation/capture is effected for all nets in the design. The GUI also permits users to quickly change the constraints through forms and preview all changes again. Information captured from the user through the GUI may include, for example, the number of trunks to impose for a given net, as well as information previously discussed relative to the GUI of FIG. 3 such as max/min trunk length and max/min twig lengths.

At 506, the logical tree is constructed and presented to the user through the GUI. The logical tree is constructed in accordance with the constraints that had been specified by the user. The logical tree would include one or more trunks configured to connect to a set of pins, where the structure of topology pertains specifically to locations and quantities of the trunks relative to the pins.

At 508, a determination is made whether the results are acceptable to the user. It is at this stage that the user is able to fix the structure of the ideal configuration. If the user does not find the proposed structure acceptable, then the process loops back to 502 to receive revised constraints/guidance from the user to change the tree structure to be constructed. If, however, the user finds the proposed structure acceptable, then the ideal configuration is saved into the tree structure and the process proceeds to the next step.

At 510, physical implementation of the routing for the design is implemented. The right-hand portion of FIG. 5 shows a more detailed flow of the implementation step. At 520, the process completes generation for the entire "forest" of all the nets for the design. This step completes the generation of any additional structures needed for all of the logical trees pertinent for routing.

Steps 522 through 526 pertain to Loop B, which in some embodiments is automatically performed by the routing system. At 522, based on any congestion identified in the logical tree configuration, adjustments may be made to some or all the tree structures to both satisfy both the users' constraint and resolve the congestion.

In the present embodiment, the specified trunks are considered as a whole object during congestion analysis and tree adjustment cycle in order to match user intent and resolve congestion problems. This approach therefore provides an advantage over strict area-based routers, which consider each area of the design by itself to address congestion problems, which as a result may break a trunk into multiple disparate pieces. Breaking a trunk into smaller pieces, though not always desired, is not the worst thing that could happen to a topology. Sometimes one does need to break trunks to trade off reducing congestions. What is even worse is that a conventional strict area-based router may connect together the wires at different levels of the tree, and totally destroy the tree structure users desire to maintain. In contrast, since the present approach considers congestion of trunks and congestion of twigs separately and addresses trunk-based congestion for a trunk as a whole, this means that the entirety of the trunk is considered for resolving congestion problems, making it less likely that the trunk will be broken up or re-connect crossing levels in a way that frustrates the user's structural intents. Tradeoffs can be taken between trunk congestion and twig congestion to identify optimal ways to meet the user intention for the topology. As discussed in more detail below, electromigration (EM) analysis may also be performed to affect the tree adjustment actions of this phase, since any adjustments made for EM purposes would also likely affect congestion considerations as well.

After an adjustment has been made to the tree(s)/forest, the congestion of the revised tree configuration may be examined again at 524. A determination is made at 526 whether any trees in the forest still need to be adjusted, e.g., because of any congestion problems that remain. If so, then the process returns back to step 522 to perform another adjustment to the tree(s). If no additional adjustments are necessary, then the process proceeds to the next step for physical realization.

At 527, realization/optimization of the physical design for the route is implemented. This action may be performed, for example, by first initializing the order of implementation of all trunks for physical design. The order in which the trunks are handled may change the results of a routing solution, since an earlier implementation of a first trunk will create blockages/constraints that affect the ability of the later trunks to be adequately routed. In some embodiments, the ordering of the trunks may start with critical trunks and/or shorter trunks as higher priorities, with lower priorities for non-critical trunks and longer trunks. Congestion analysis may also be applied to determine the order of the trunks for processing.

Multiple iterations may be conducted to implement an optimization process for physically realizing the trunks. This may be accomplished, for example, by performing the following: (a) Implementation of the logical trunks in all trees based on a current order; (b) Evaluation of the order based on failure and/or deviation of true shapes; (c) Adjustment to the implementation of the order and/or constraints; (d) Undoing the related logical trunks (e.g., by removing true shapes associated with the logical tree); (e) Re-implementing the logical trunks, and then re-evaluating the order; and (f) Performing the above for each level of trunks up and down the tree.

In addition to the above, final implementation and completion may be performed for the forest at this stage. This action may include trunk-welding or trunk-trimming for some or all of the trunks. Trunk-welding refers to an action to mate two trunks together, e.g., to weld a first level trunk tot a second level trunk. Trunk trimming refers to an action to remove any excess trunk material that extends past a desired or designated trunk end-location.

Actions may also be taken at this point to realize twigs by connecting pins to trunks. For example, the P2T approach may be employed at this point to implement the twigs. In addition, if necessary, optional actions can be taken to use an MST approach, e.g., to implement detail routing for outlier pins and difficult trunk-to-trunk connections. Rip-up and re-route may be performed by some or all of these actions, albeit with the intent of the overall topology being considered in any structural changes.

At 528, the final results of the realization/optimization step are reviewed. A determination is made at 530 whether the physical implementation is acceptable. If not, then the process implements Loop C, and returns back to 522 to potentially re-adjust the tree structure and to proceed with the preceding steps again to try and identify a better solution, e.g., where the Loop C iterates until the whole tree can be implemented with least opens and violations.

Once an acceptable solution has been identified, the process returns back to 512 of the main flow to complete the overall process, where final implementation can be analyzed and reports generated for users to perform a final review. Any violations of constraints can be considered by users to refine their constraints for another iteration. Therefore, at 512, a report may be generated for the user to review the topology of the final result. At 514, the user can decide whether or not to accept the result. If not, then Loop D is implemented to restart the process by returning back to 502. If the results are acceptable, then the process ends.

Figure 6A:
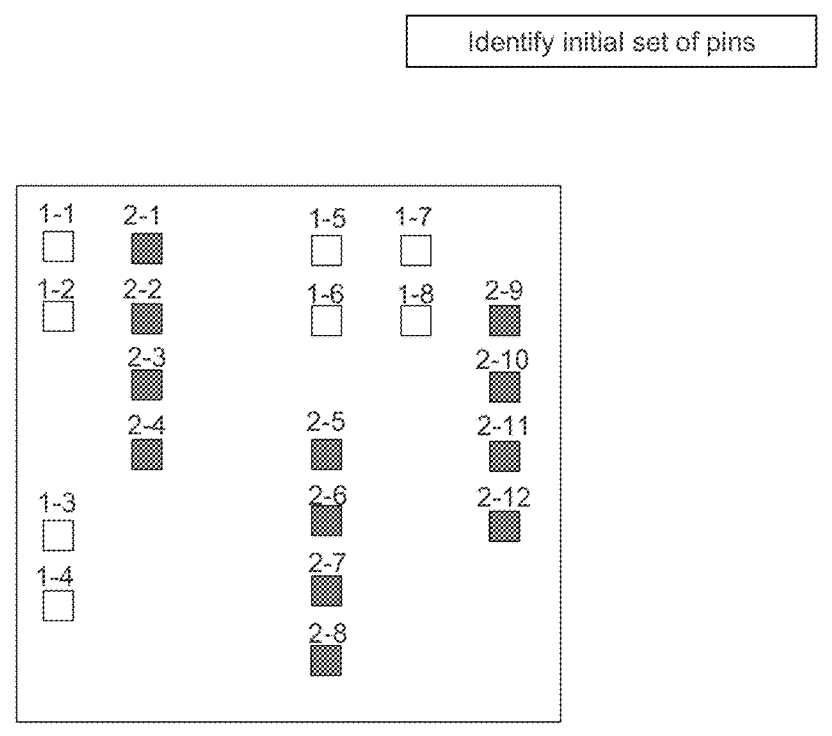
Figure 6B:
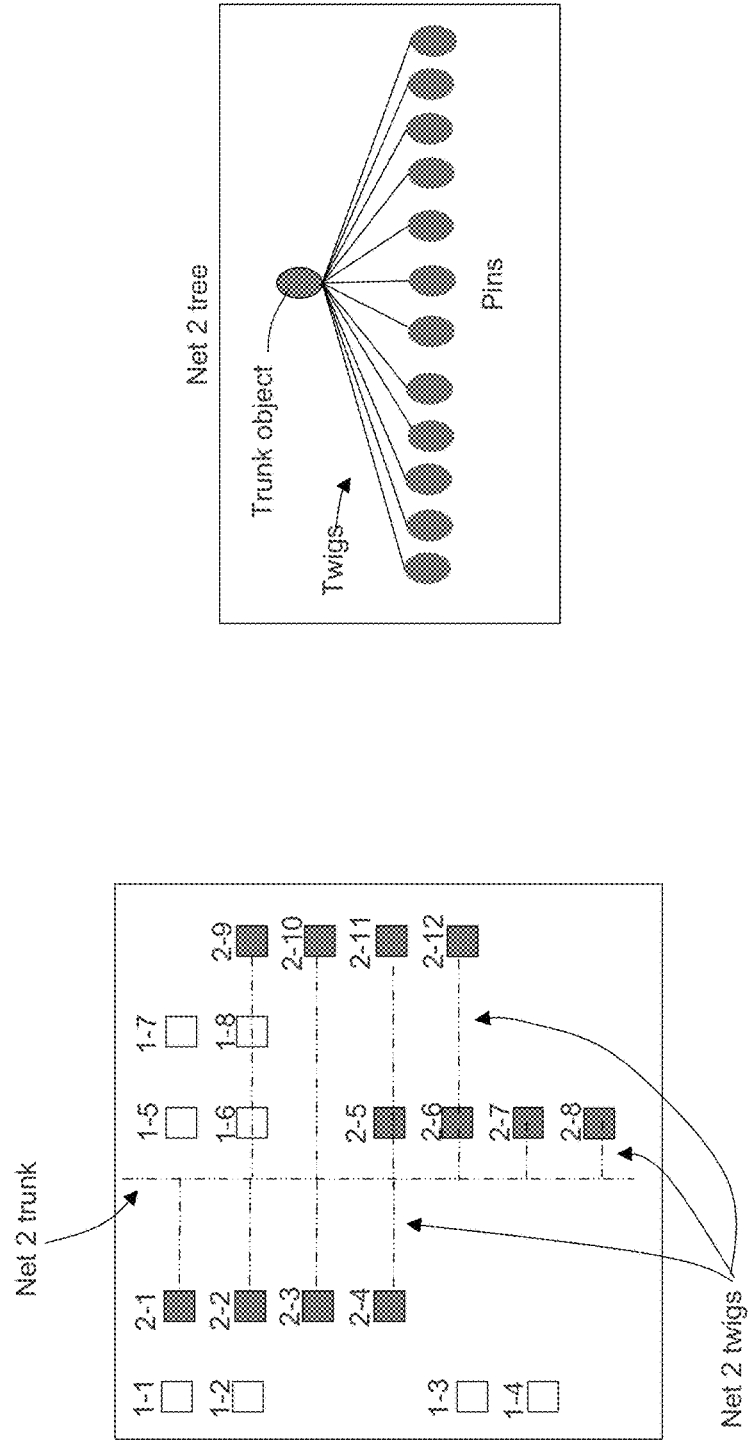

FIGS. 6A-H and 7A-G provide an illustration of this process. FIG. 6A shows a set of pins for which routing needs to be implemented. In particular, Net 1 includes a set of pins 1-1, 1-2, 1-3, 1-4, 1-5, 1-6, 1-7, and 1-8. Net 2 includes pins 2-1, 2-2, 2-3, 2-4, 2-5, 2-6, 2-7, 2-8, 2-9, 2-10, 2-11, and 2-12.

FIG. 6B shows an example configuration that may be provided for Net 2, where a single trunk is included to connect to twigs for each of the Net 2 pins. This configuration may be generated, for example, where the user has identified a twig length long enough to permit lengthy twigs to connect the remote pins to the trunk. The logical tree structure shown on the right-hand side of the figure includes a single trunk object (corresponding to the single trunk on the left side of the figure), as well as pin representations for each of the Net 1 pins (2-1, 2-2, 2-3, 2-4, 2-5, 2-6, 2-7, 2-8, 2-9, 2-10, 2-11, and 2-12) that are connected to the Net 1 trunk.

Figure 6C:
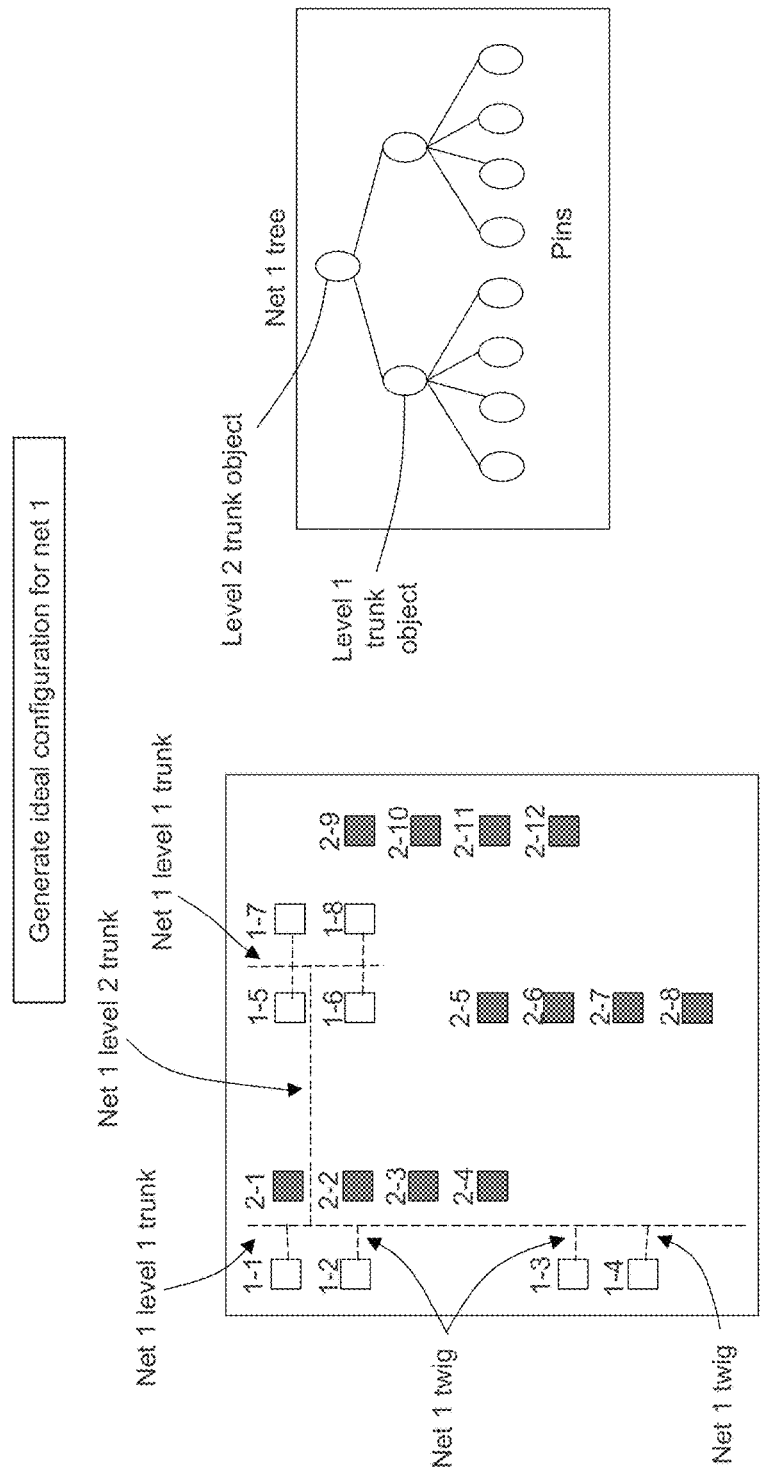

FIG. 6C shows an example configuration that may be provided for Net 1. Assume that the max twig length constraints are set such that a single trunk is not capable of satisfying that constraint. In this situation, the net 2 configuration may be implemented with two level 1 trunks, where each are associated with a set of pins having twig lengths that comply with the max twig length constraints. Here, the first level 1 trunk is associated with pins 1-1, 1-2, 1-3, 1-4 and the second level 1 trunk is associated with pins 1-5, 1-6, 1-7, 1-8. A single level 2 trunk may be included to connect the two level 1 trunks together. The logical tree structure shown on the right-hand side of the figure includes multiple trunk objects corresponding to these level 1 and level 2 trunks, as well as pin representations for each of the Net 1 pins.

Figure 6D:
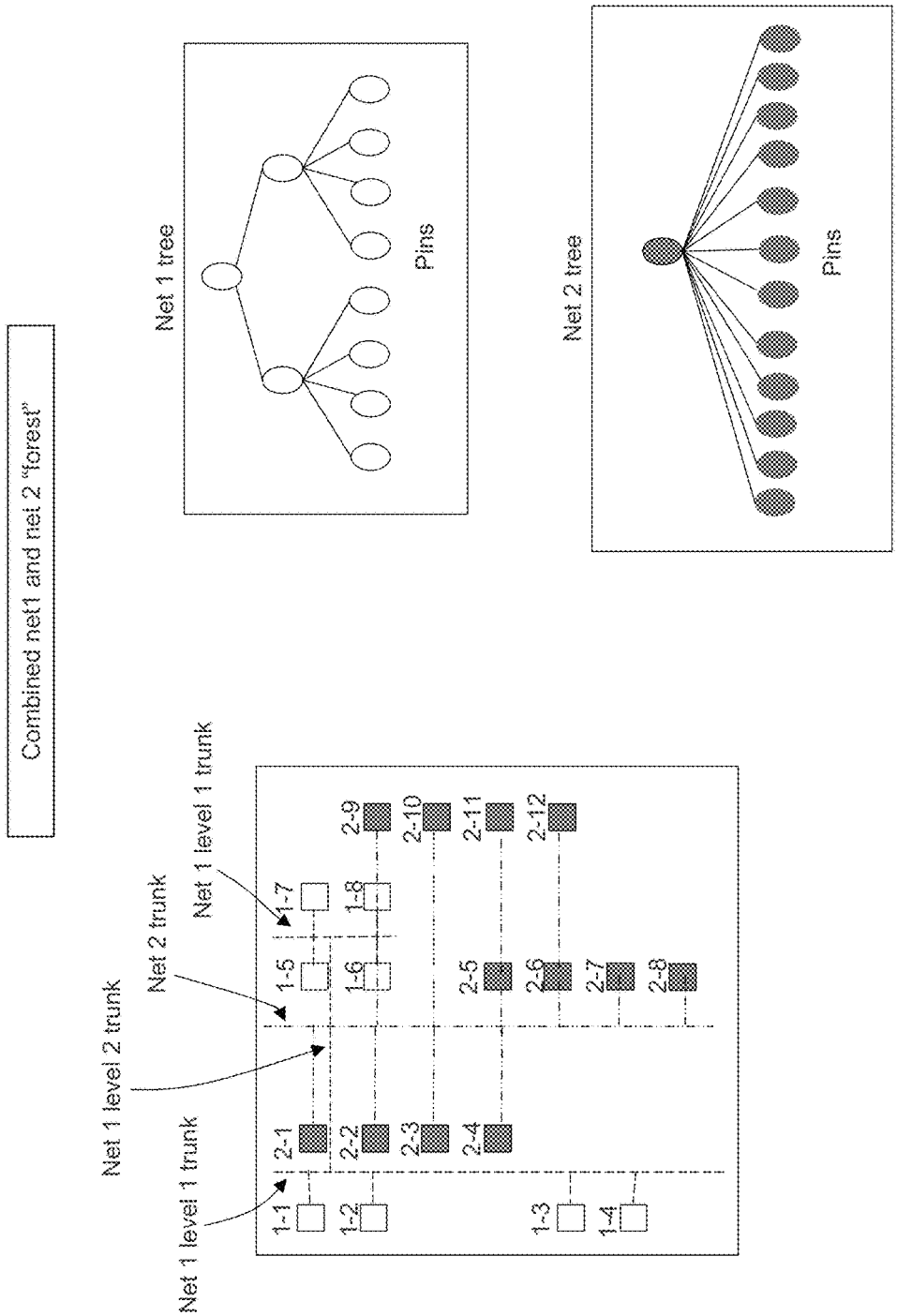

Assume that the user accepts both of the configurations shown in FIGS. 6B and 6C. These configurations can now be set as the "ideal" configurations. FIG. 6D shows the "forest" having the logical tree configurations for both Net 1 and Net 2.

Figure 6E:
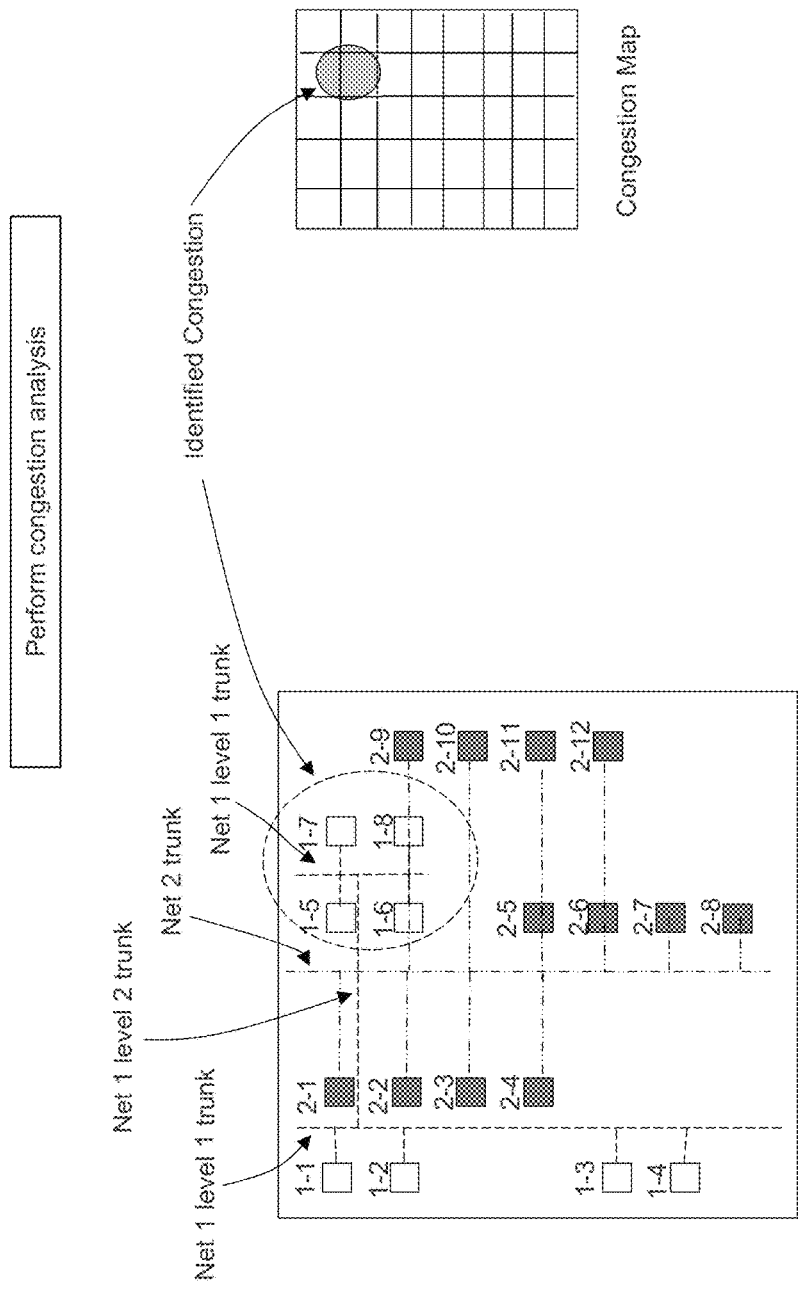

As shown in FIG. 6E, Congestion analysis is performed upon the logical tree. A congestion map may be employed to perform the congestion analysis. The congestion analysis may consider, for example, density and twig conflicts that exist within a given portion of the logical tree. Here, it is assumed that congestion is identified in the circled region that encompasses pins 1-5, 1-6, 1-7, 1-8, and 2-9, e.g., due to the twig conflict between the trees for the two nets.

Numerous approaches may be taken to resolve the congestion. For example, trunks may be moved, relative to constraints that may have been established for flexibility in the location of a trunk. In addition, the number of trunks and/or locations of trunks may be adjusted to address a conflict.

Figure 6F:
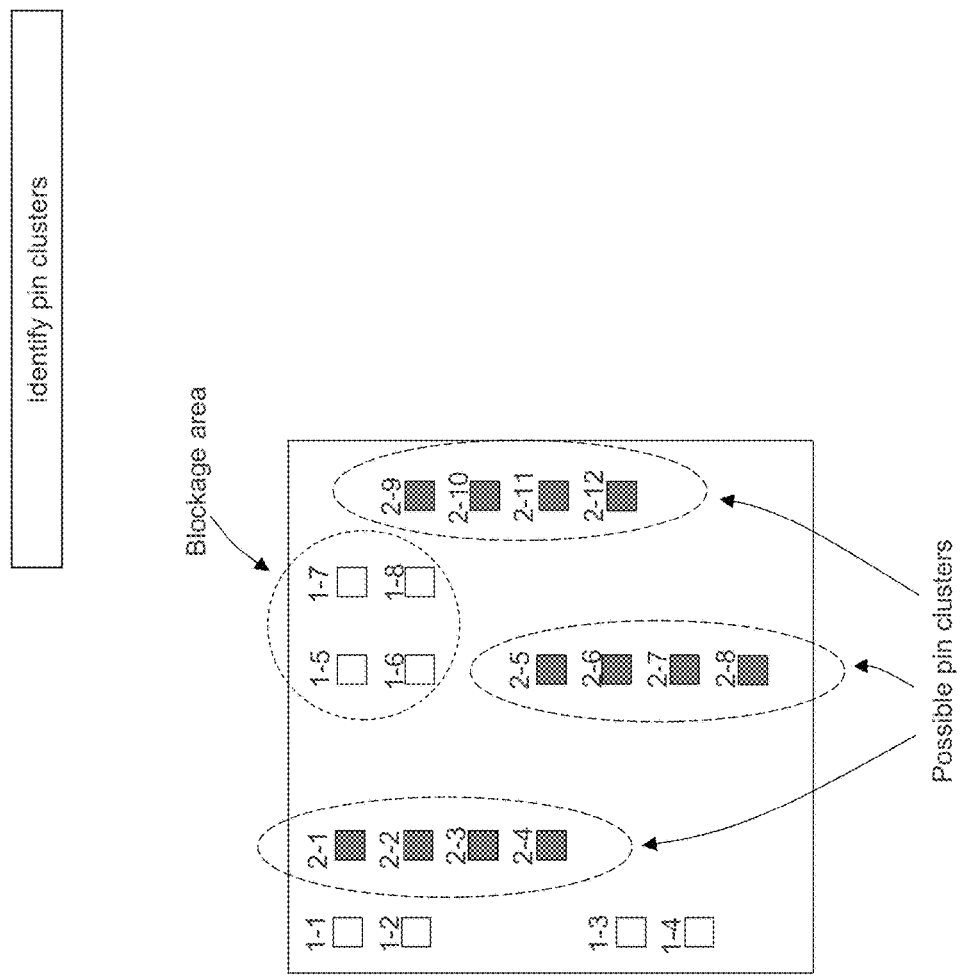

Assume that the configuration for Net 1 is to be changed. FIG. 6F identifies the pin clusters within the set of Net 1 pins that may be grouped to together to identify a new configuration. Pin clustering is performed to identify possible groupings of pins that can be used to configure the tree to areas of the congestion. Those areas of congestion may essentially act as blockage areas to identify how to connect the pins together.

Figure 6G:
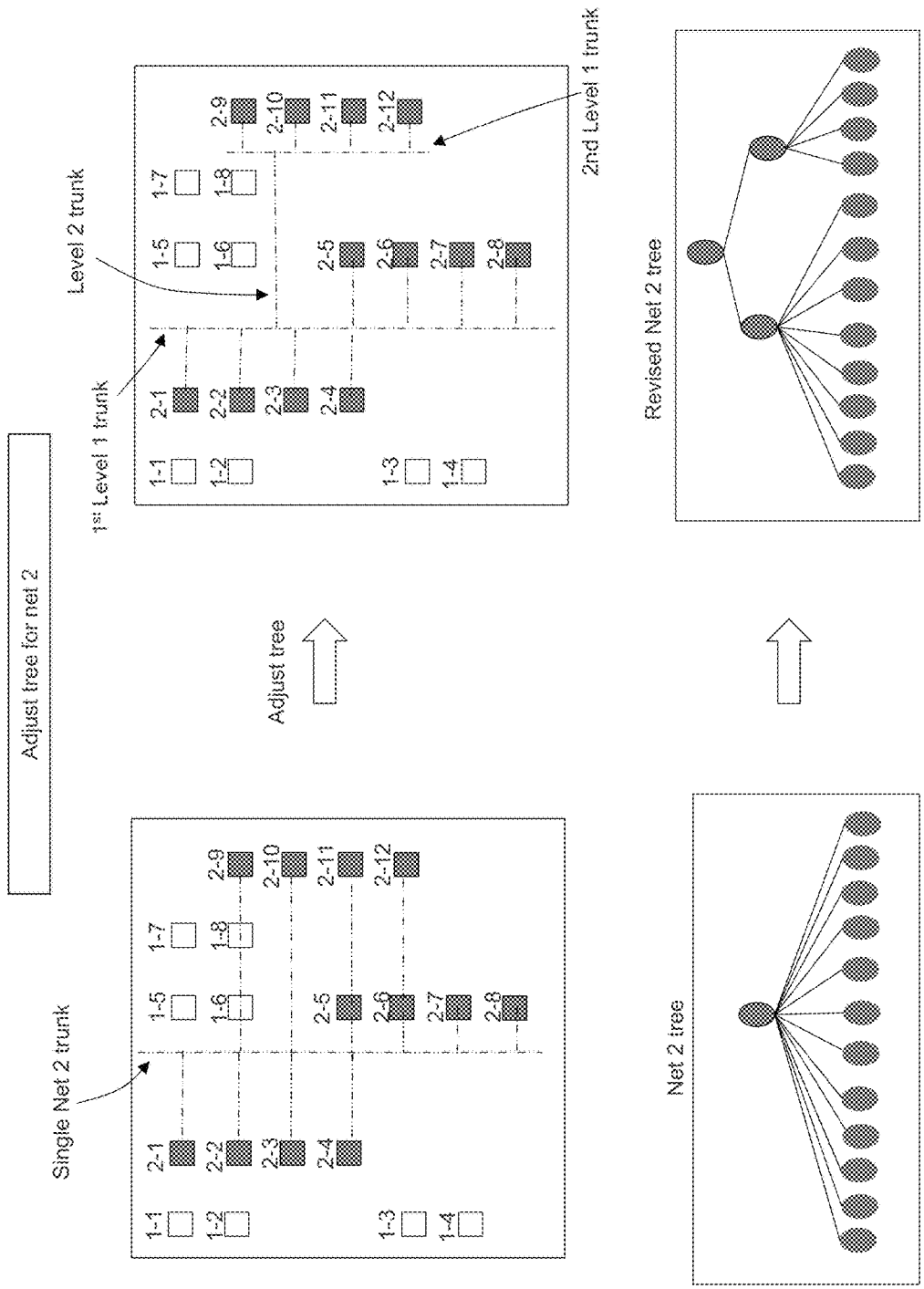
Figure 6H:
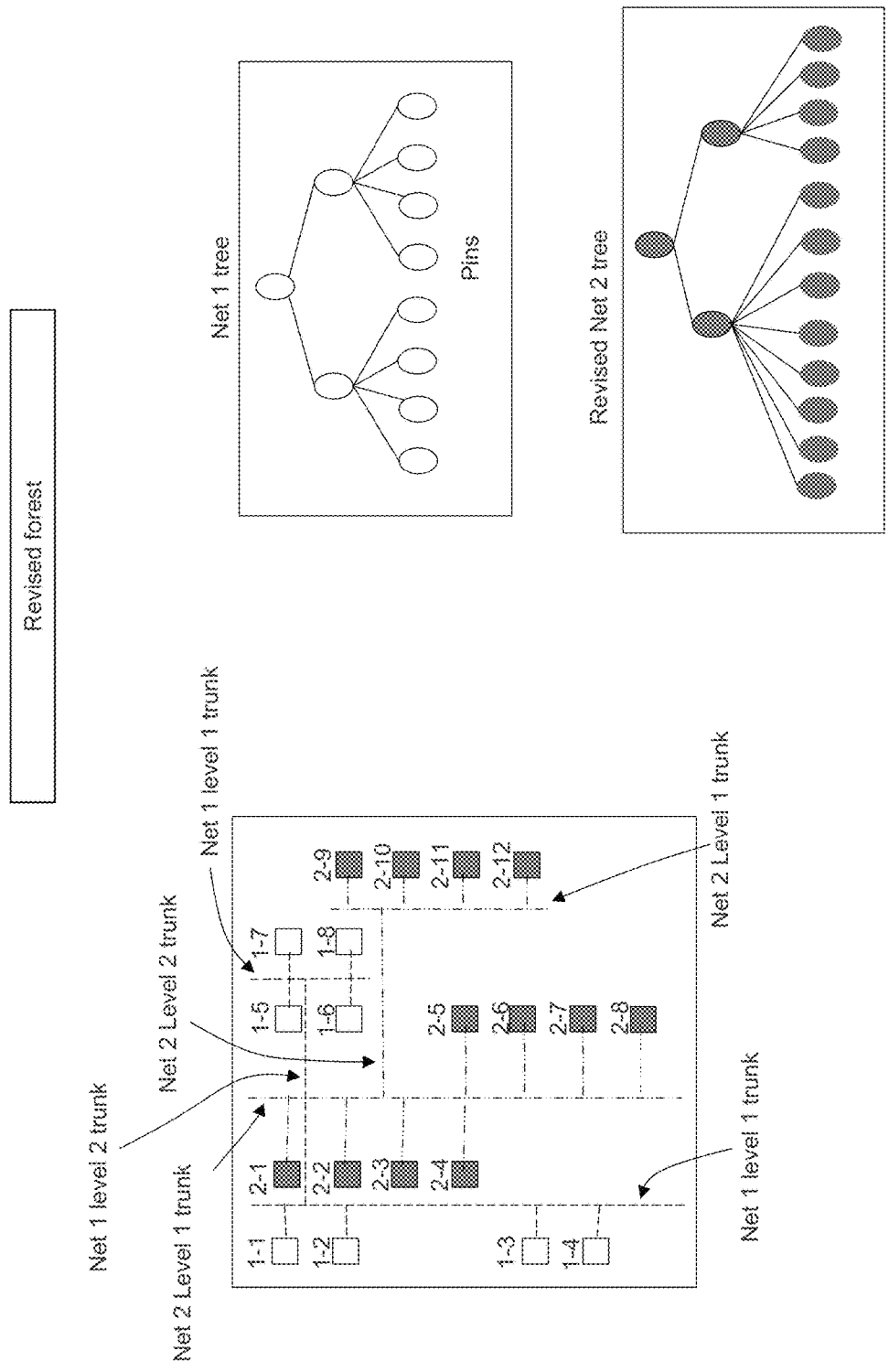

FIG. 6G shows an example approach that may be taken to adjust the trees to resolve congestion, where the Net 1 configuration is changed to a revised configuration. In particular, as shown in this figure, the single Net 1 trunk is changed to two level 1 trunks, and a new level 2 trunk is included to connect the two level 1 trunks. The tree structure for this new configuration is also updated to reflect the multiple levels of the trunk objects, as well as the specific pins that belong to each level 1 trunk. FIG. 6H shows the revised forest with the combination of the net 1 tree and the net 2 tree.

Figure 7A:
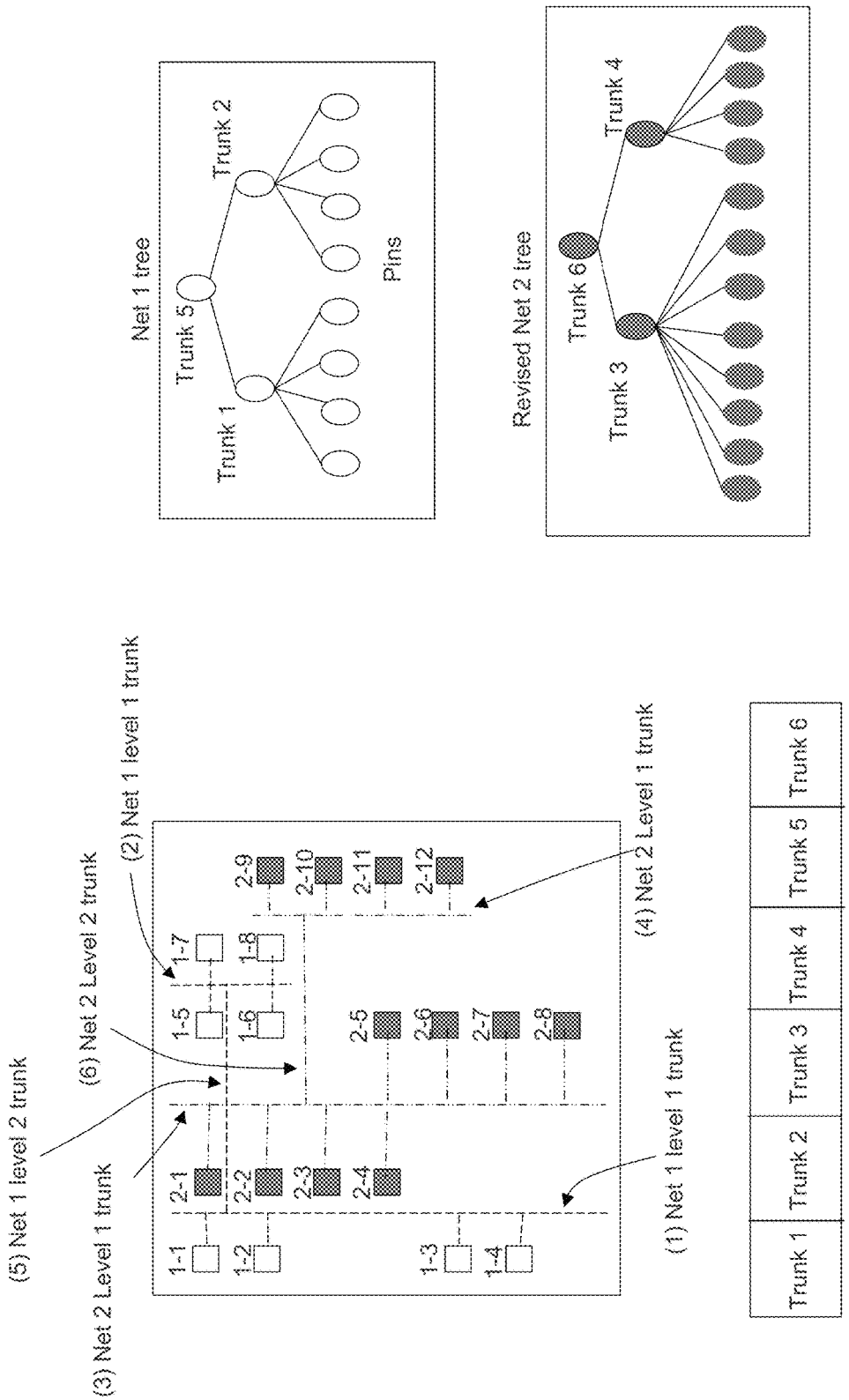
Figure 7B:
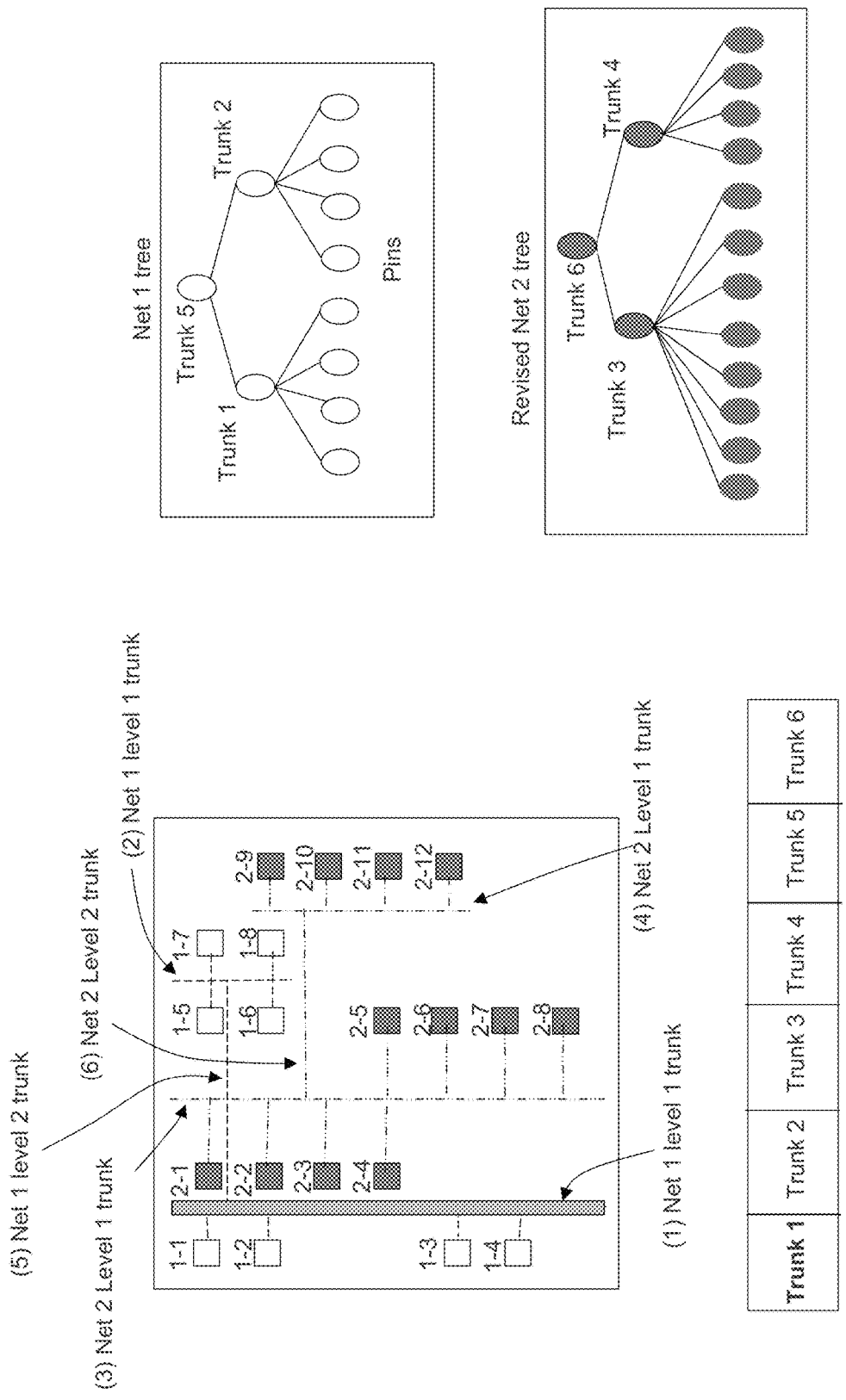
Figure 7C:
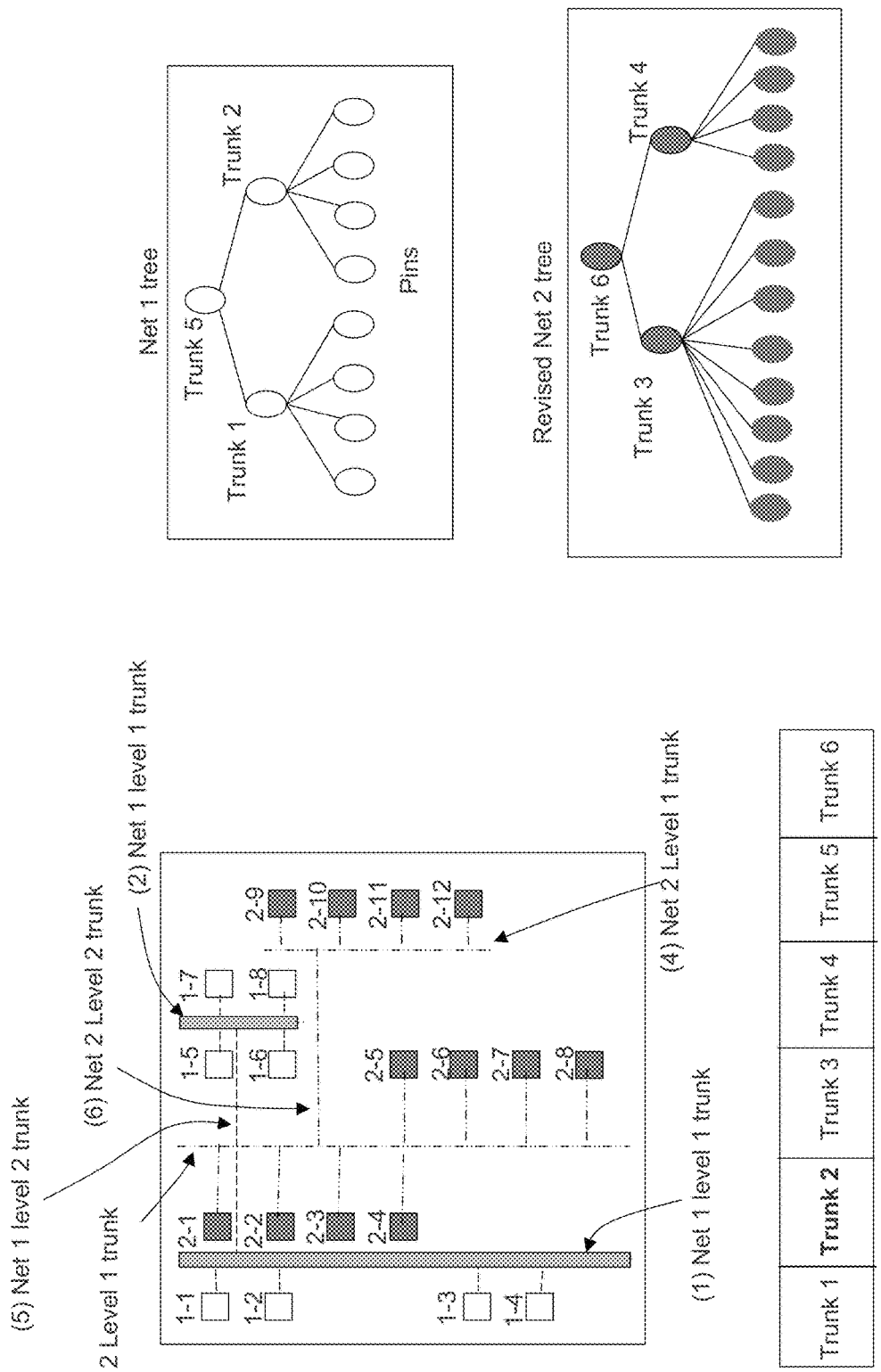
Figure 7D:
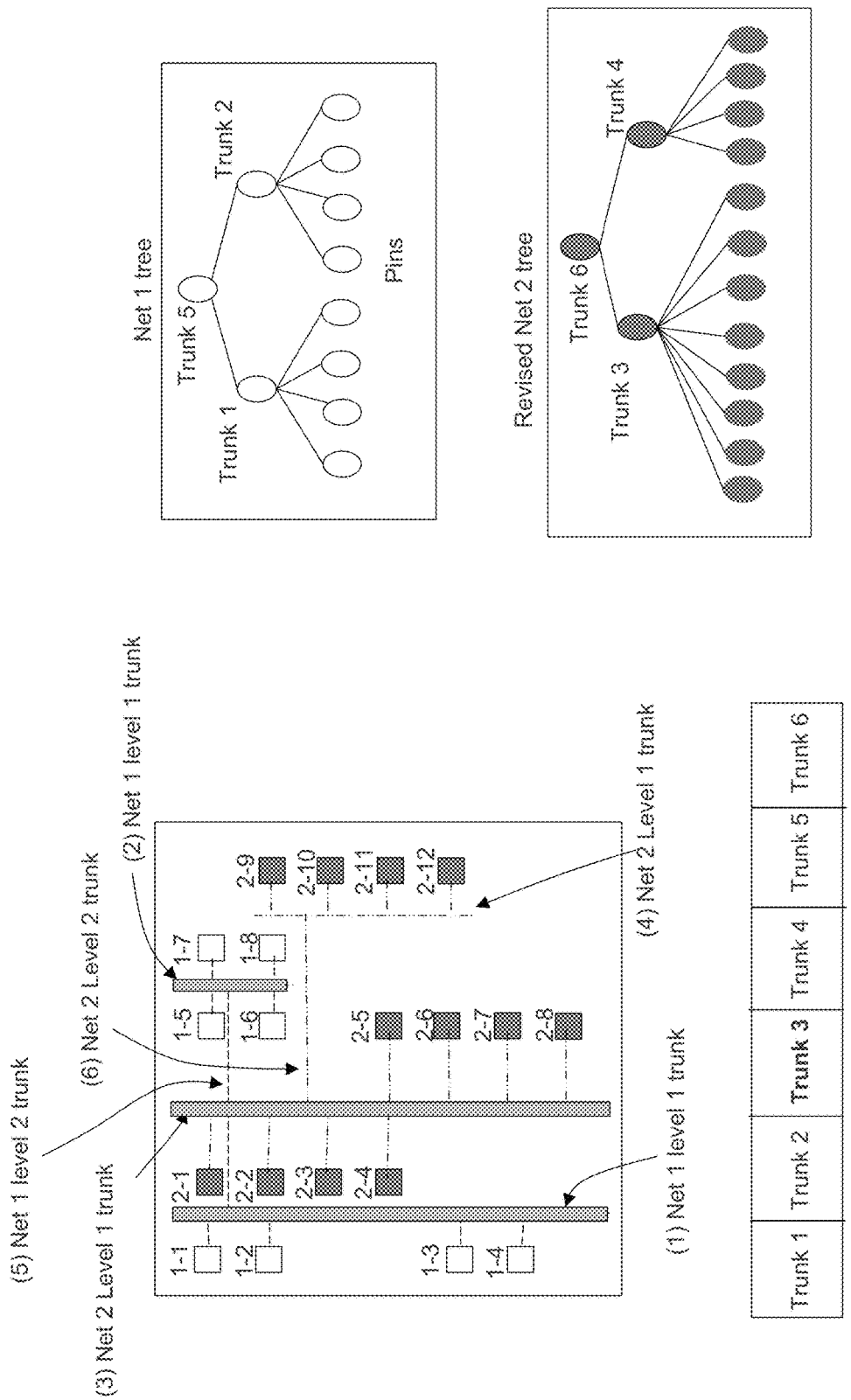
Figure 7E:
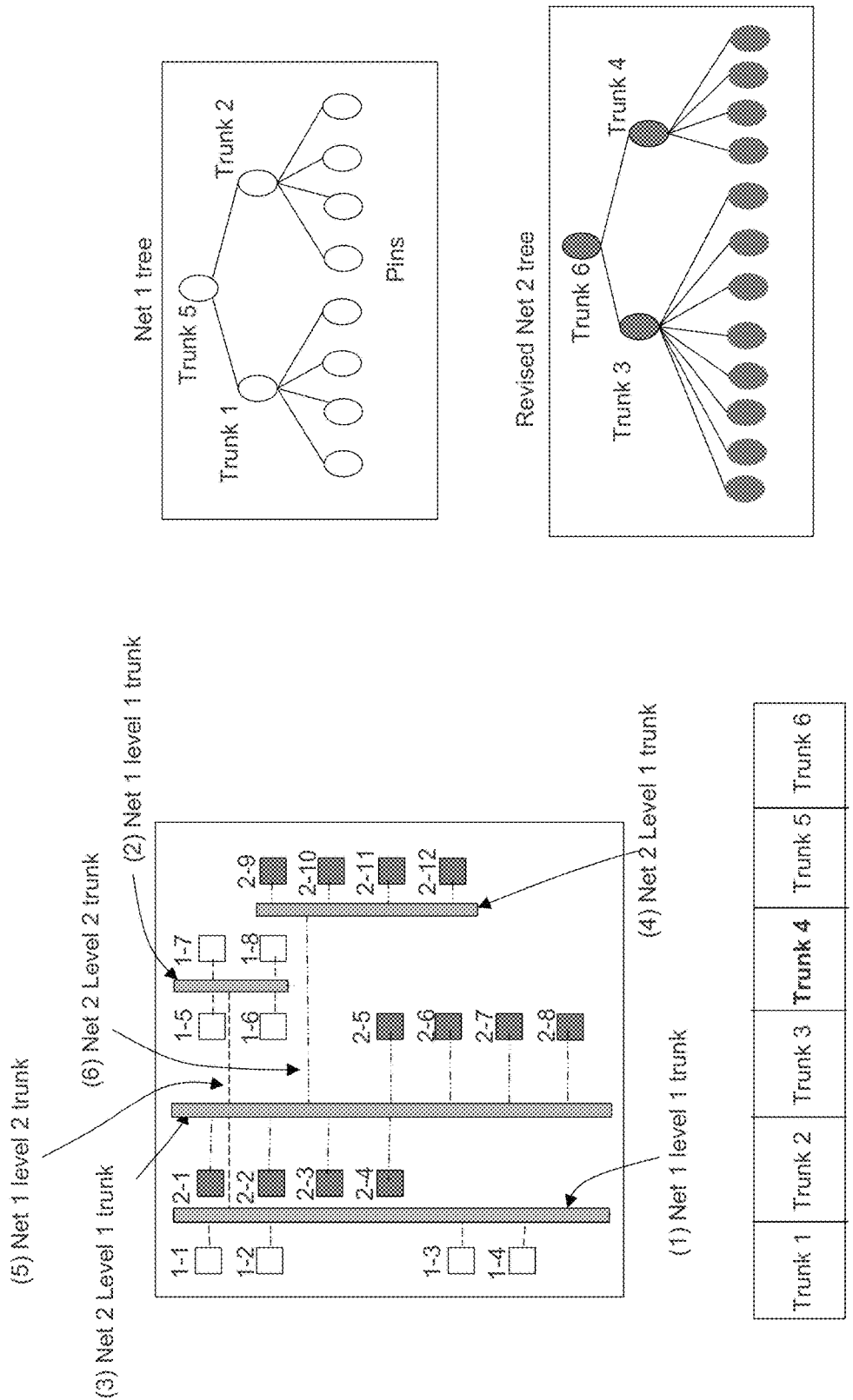
Figure 7F:
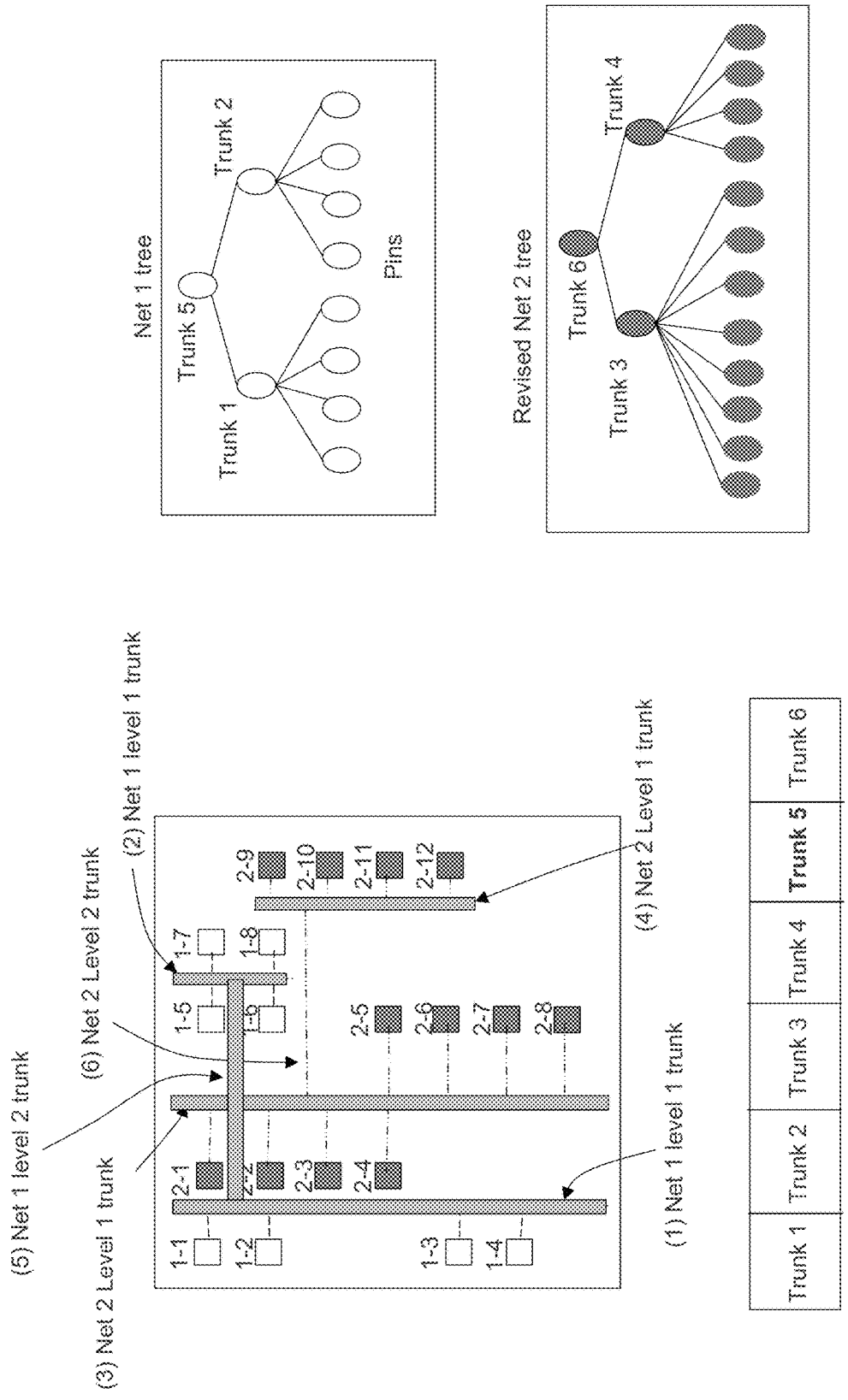
Figure 7G:
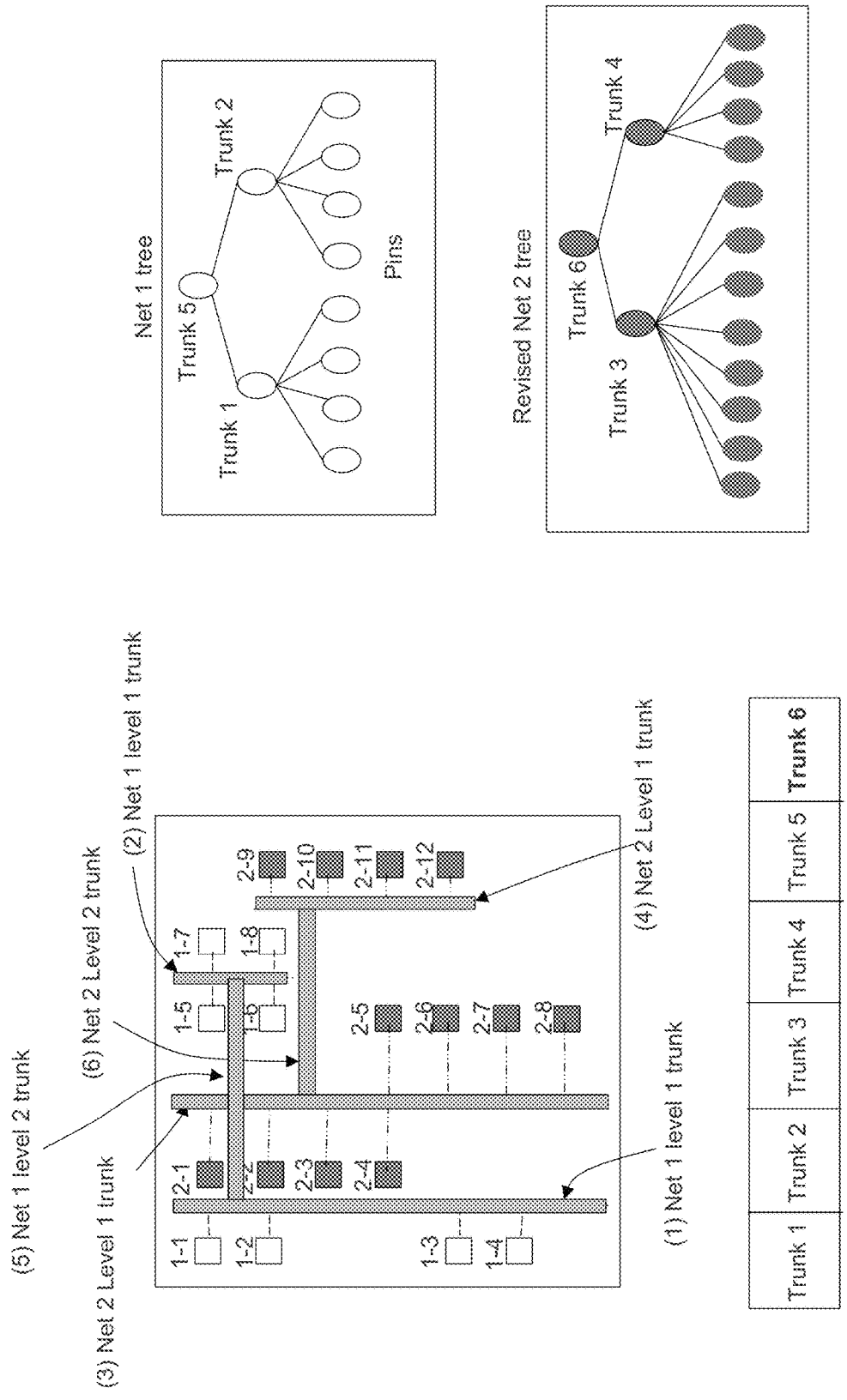

At this point, physical realization/optimization may be performed on the design. This action takes into consideration the order of the trunks to be processed. As previously noted, the order in which the trunks are processed may change the results of a routing solution, since an earlier implementation of a first trunk will create blockages/constraints that affect the ability of the later trunks to be adequately routed. FIG. 7A shows an example order for processing the trunks where trunks 1-6 are processed in the shown numerical order. FIG. 7B shows the first trunk 1 being physically realized, with trunk 2 physically implemented in FIG. 7C, trunk 3 physically implemented in FIG. 7D, trunk 4 physically implemented in FIG. 7E, trunk 5 physically implemented in FIG. 7F, and trunk 6 physically implemented in FIG. 7G.

Figure 8:
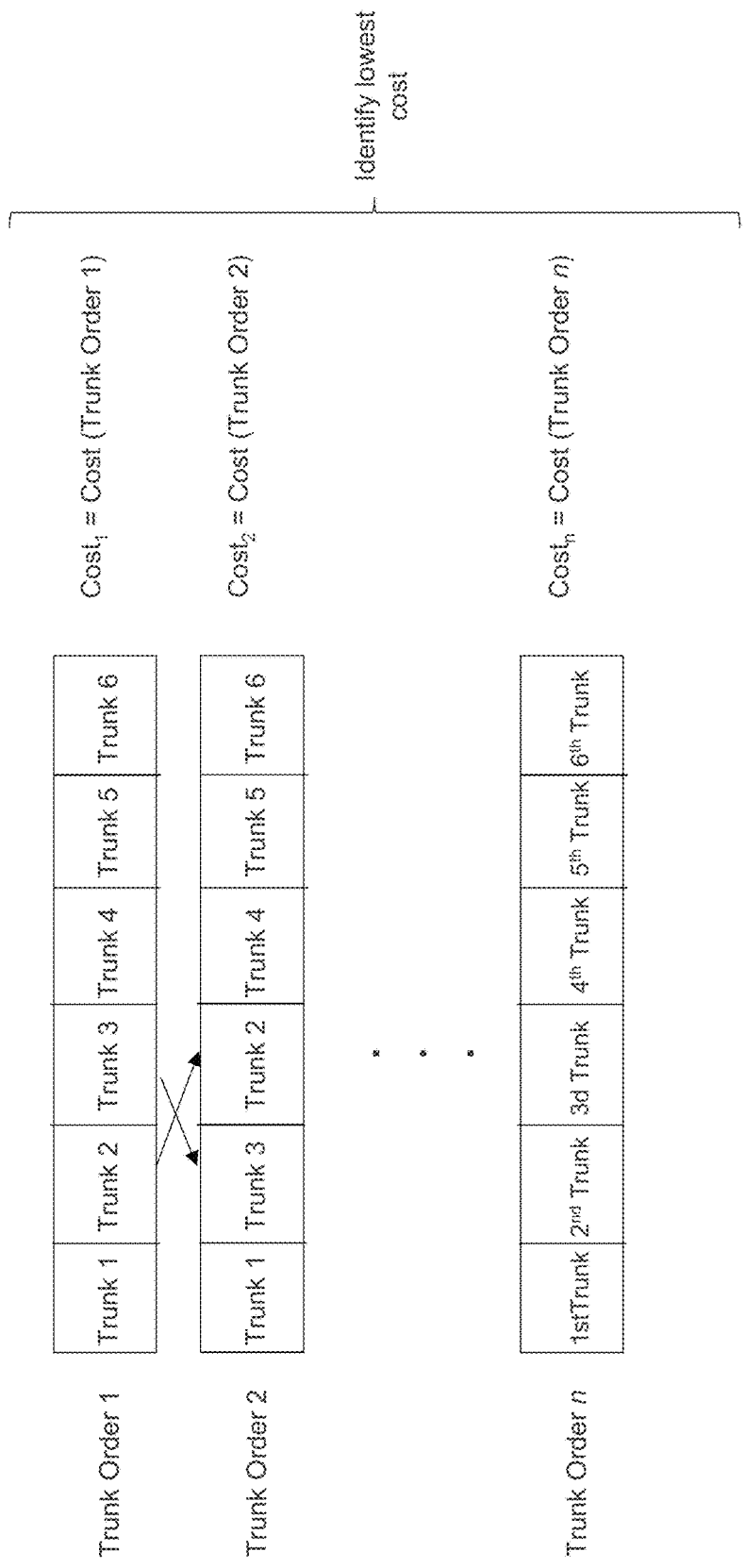
FIG. 8 illustrates different ordering for iterations of the realization process.

As illustrated in FIG. 8, multiple iterations of the realization process may be executed, with a different order for each execution. A cost can be calculated for each solution determined by each order, with the cost including cost factors for errors, violations, EM factors, as well as variation from the ideal configuration. At the end of the iterative process, the solution having the lowest cost can be selected. Even there are multiple topologies that satisfy 100% of the users' constraints, they may be evaluated with same or different costs from time to time. This is pertinent because, as discussed above, cost-based analysis may be taken to evaluate costs of various topology changes. A particular topology may have a different cost (higher or lower) from that of the ideal one at certain times. In some cases the different cost may not necessarily be because it deviates from the "ideal" one or necessarily violating any of user's constraints, but rather it generates different congestion during the dynamic process of placement of all or a portion of the forest. Congestion changes during the process causes the changes of the costs of topologies, and then through evaluating and knowing that some topologies are having lower cost, the new ideal ones get picked, and the implementation also change accordingly, and the overall congestion gets eliminated gradually and becomes minimum at the end of the process.

Various user interfaces may be provided to allow the user to visualize and evaluate the implemented design topology. For example, FIGS. 3C-D illustrate an example user interfaces 310a-b which includes multiple display portions, with a first portion 312 displaying trunk locations in the ideal tree and a second portion 314 that shows the implemented tree. A user can use this type of interface to compare the original topology to see the extent of matching or non-matching that has occurred during the physical implementation process. In the case of FIG. 3C, the interface 310a illustrates the circumstance where the trunk locations in the ideal tree match those in the implemented tree. In contrast, the interface 310b in FIG. 3D illustrates the circumstance where the trunk locations in the ideal tree does not match those in the implemented tree. As previously noted, the user may choose to accept the implemented topology, or may choose to enter the previously-described looping functionality to change/revise various parameters to revise the implemented topology.

Therefore, what has been described is an improved approach to implement routing for electrical designs. The inventive approach provides a structural routing solution, where an automatic routing mechanism is implemented to generate a complete routing tree. The approach captures users' design intent about the topology, and the routing system adhere to that topology intent throughout the layout process. A congestion-driven, fish-bone-style router is implemented for custom-digital/memory-style designs.

System Architecture Overview

Figure 9:
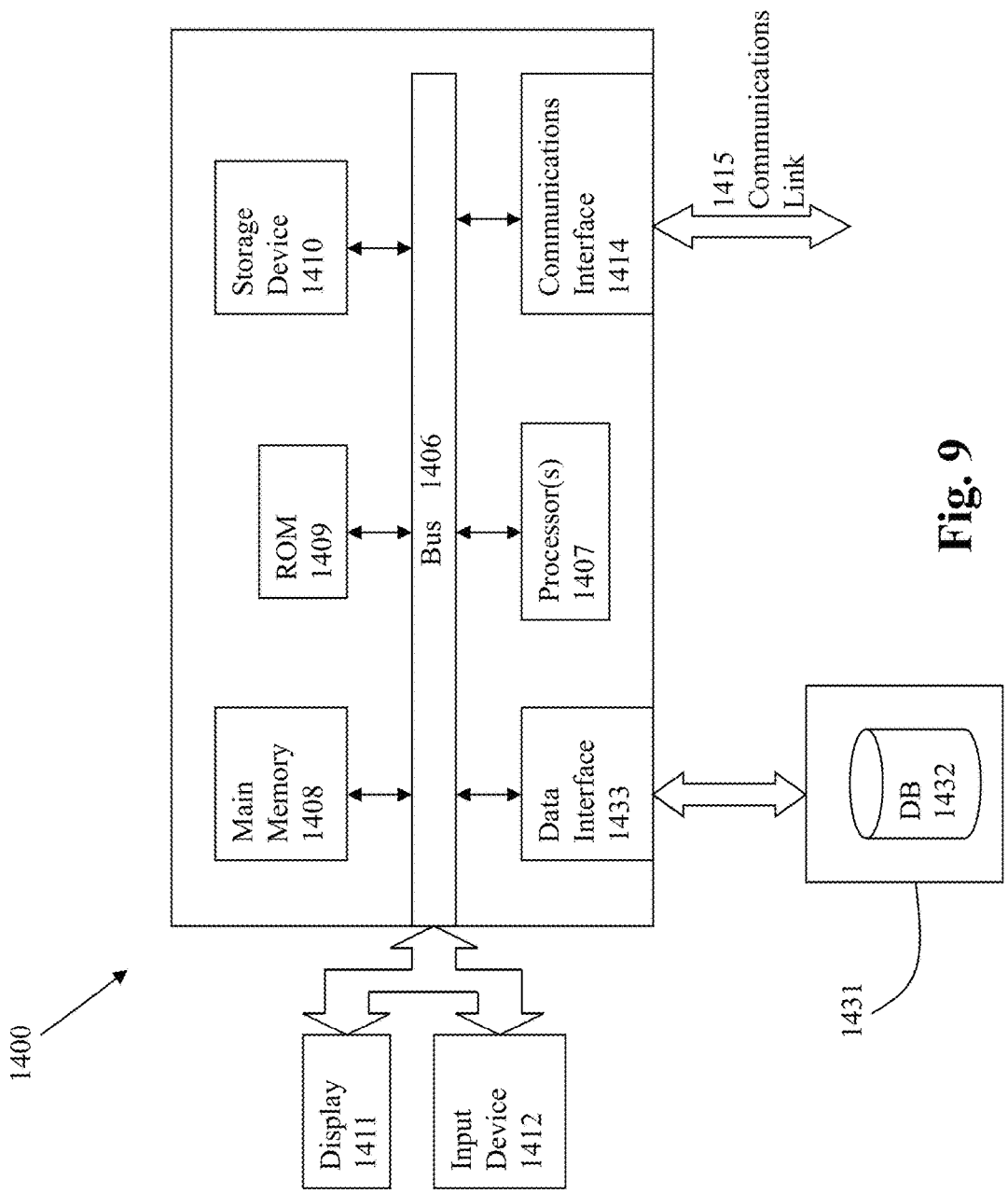
FIG. 9 depicts a computerized system on which some embodiments of the invention can be implemented.

FIG. 9 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media include, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, e.g., application code, through communication link 1415 and communication interface 1414. Received program code may be executed by processor 1407 as it is received, and/or stored in disk drive 1410, or other non-volatile storage for later execution. Computer system 1400 may communicate through a data interface 1433 to a database 1432 on an external storage device 1431.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A method implemented with a processor to generate a user interface for implementing an electronic design, the method comprising:
implementing a first portion of a user interface having controls to configure constraints for a topology of an electronic design, wherein
a reference topology is determined for the electronic design that conforms to the constraints, the reference topology having a trunk structure and one or more pins connected with the trunk structure through one or more twig structures;
implementing a second portion of the user interface to display the reference topology, wherein
the second portion of the user interface changes a displayed version of the reference topology as the controls in the first portion of the user interface is modified to change the constraints; and
generating or updating a physical implementation of the electronic design at least by resolving a congesting issue in the electronic design to comply with one or more design rules, resolving the congesting issue comprising modifying a tree structure that represents a plurality of nets in the electronic design.

2. The method of claim 1, wherein the controls in the first portion of the user interface comprises control elements to control one or more of trunk orientation, maximum trunk length, minimum trunk length, trunk orientation, maximum twig length, or maximum number of pins per trunk.

3. The method of claim 1, wherein the controls in the first portion of the user interface includes a first set of control elements to configure a first set of trunk constraints corresponding to a first level of trunks and a second set of control elements to configure a second set of trunk constraints corresponding to a second level of trunks.

4. The method of claim 1, wherein the tree structure comprises a first set of nodes for a first level of trunks, a second set of nodes for a second level of trunks, and a third set of nodes for pins in the electronic design.

5. The method of claim 1, wherein generating or updating the physical implementation is performed for the electronic design at least by generating a forest of trees for the plurality of nets in the electronic design, adjusting the tree structure to resolve a plurality of congestion issues; performing realization of the physical implementation for the electronic design, and reviewing results for the physical implementation to determine compliance with a plurality of design rules.

6. The method of claim 1, wherein the user interface further comprises a display having a reference display portion and a physical implementation display portion, the reference display portion displays a first image of the reference topology, and the physical implementation display portion displays a second image of the physical implementation of the electronic design.

7. The method of claim 6, wherein the reference display portion and the physical implementation display portion are simultaneously displayed in the user interface.

8. A computer program product embodied on a non-transitory computer readable medium having stored thereon a sequence of instructions which, when executed by a processor, causes the processor to execute a set of acts to generate a user interface for implementing an electronic design, the set of acts comprising:
implementing a first portion of a user interface having controls to configure constraints for a topology of an electronic design, wherein
a reference topology is determined for the electronic design that conform to the constraints, the reference topology having a trunk structure and one or more pins connected with the trunk structure through one or more twig structures;
implementing a second portion of the user interface to display the reference topology, wherein the second portion of the user interface changes a displayed version of the reference topology as the controls in the first portion of the user interface is modified to change the constraints; and generating or updating a physical implementation of the electronic design at least by resolving a congesting issue in the electronic design to comply with one or more design rules, resolving the congesting issue comprising modifying a tree structure that represents a plurality of nets in the electronic design.

9. The computer program product of claim 8, wherein the controls in the first portion of the user interface comprises control elements to control one or more of trunk orientation, maximum trunk length, minimum trunk length, trunk orientation, maximum twig length, or maximum number of pins per trunk.

10. The computer program product of claim 8, wherein the controls in the first portion of the user interface includes a first set of control elements to configure a first set of trunk constraints corresponding to a first level of trunks and a second set of control elements to configure a second set of trunk constraints corresponding to a second level of trunks.

11. The computer program product of claim 8, wherein the tree structure comprises a first set of nodes for a first level of trunks, a second set of nodes for a second level of trunks, and a third set of nodes for pins in the electronic design.

12. The computer program product of claim 8, wherein generating or updating the physical implementation is performed for the electronic design at least by generating a forest of trees for the plurality of nets in the electronic design, adjusting the tree structure to resolve a plurality of congestion issues; performing realization of the physical implementation for the electronic design, and reviewing results for the physical implementation to determine compliance with a plurality of design rules.

13. The computer program product of claim 8, wherein the user interface further comprises a display having a reference display portion and a physical implementation display portion, the reference display portion displays a first image of the reference topology, and the physical implementation display portion displays a second image of a physical implementation of the electronic design.

14. The computer program product of claim 13, wherein the reference display portion and the physical implementation display portion are simultaneously displayed in the user interface.

15. A system to generate a user interface for implementing an electronic design, the system comprising:
a processor; and
a memory for holding programmable code, wherein the programmable code includes instructions which, when executed by the processor, cause the processor to
implement a first portion of a user interface having controls to configure constraints for a topology of an electronic design, wherein
a reference topology is determined for the electronic design that conforms to the constraints, the reference topology having a trunk structure and one or more pins connected with the trunk structure through one or more twig structures;
implement a second portion of the user interface to display the reference topology, wherein
the second portion of the user interface changes a displayed version of the reference topology as the controls in the first portion of the user interface is modified to change the constraints; and
generate or update a physical implementation of the electronic design at least by resolving a congesting issue in the electronic design to comply with one or more design rules, resolving the congesting issue comprising modifying a tree structure that represents a plurality of nets in the electronic design.

16. The system of claim 15, wherein the controls in the first portion of the user interface comprises control elements to control one or more of trunk orientation, maximum trunk length, minimum trunk length, trunk orientation, maximum twig length, or maximum number of pins per trunk.

17. The system of claim 15, wherein the controls in the first portion of the user interface includes a first set of control elements to configure a first set of trunk constraints corresponding to a first level of trunks and a second set of control elements to configure a second set of trunk constraints corresponding to a second level of trunks.

18. The system of claim 15, wherein the tree structure comprises a first set of nodes for a first level of trunks, a second set of nodes for a second level of trunks, and a third set of nodes for pins in the electronic design.

19. The system of claim 15, wherein generating or updating the physical implementation is performed for the electronic design at least by generating a forest of trees for the plurality of nets in the electronic design, adjusting the tree structure to resolve a plurality of congestion issues; performing realization of the physical implementation for the electronic design, and reviewing results for the physical implementation to determine compliance with a plurality of design rules.

20. The system of claim 15, wherein the user interface further comprises a display having a reference display portion and a physical implementation display portion, the reference display portion displays a first image of the reference topology, and the physical implementation display portion displays a second image of a physical implementation of the electronic design.

* * * * *